United States Patent
Azuma et al.

(10) Patent No.: US 9,543,007 B2
(45) Date of Patent: Jan. 10, 2017

(54) SEMICONDUCTOR DEVICE INCLUDING MEMORY CELL AND SENSE AMPLIFER, AND IC CARD INCLUDING SEMICONDUCTOR DEVICE

(71) Applicant: Panasonic Intellectual Property Management Co., Ltd., Osaka (JP)

(72) Inventors: Ryotaro Azuma, Fukui (JP); Yoshikazu Katoh, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/166,152

(22) Filed: May 26, 2016

(65) Prior Publication Data

US 2016/0365140 A1 Dec. 15, 2016

(30) Foreign Application Priority Data

Jun. 10, 2015 (JP) .................................. 2015-117785

(51) Int. Cl.

| | |
|---|---|
| *G11C 11/419* | (2006.01) |
| *G11C 7/14* | (2006.01) |
| *G11C 7/06* | (2006.01) |
| *G11C 7/22* | (2006.01) |
| *G11C 13/00* | (2006.01) |

(52) U.S. Cl.
CPC ............. *G11C 13/004* (2013.01); *G11C 7/067* (2013.01); *G11C 7/14* (2013.01); *G11C 13/0002* (2013.01); *G11C 2013/0054* (2013.01)

(58) Field of Classification Search
CPC ............... G11C 13/004; G11C 13/0002; G11C 2013/0054; G11C 7/14; G11C 7/067

USPC .... 365/148, 158, 207, 210.1, 210.11, 210.12
See application file for complete search history.

(56) References Cited

U.S. PATENT DOCUMENTS

| | | |
|---|---|---|
| 2008/0285360 A1 | 11/2008 | Sakimura et al. |
| 2009/0327379 A1 | 12/2009 | Matsumoto et al. |
| 2011/0123022 A1 | 5/2011 | Oishi et al. |
| 2011/0199812 A1 | 8/2011 | Kitagawa et al. |
| 2011/0299320 A1 | 12/2011 | Kono |
| 2015/0179251 A1 | 6/2015 | Yoshimoto et al. |

FOREIGN PATENT DOCUMENTS

| | | |
|---|---|---|
| JP | 2004-355670 | 12/2004 |
| JP | 2008-299595 | 12/2008 |
| JP | 2011-113136 | 6/2011 |
| JP | 2011-165297 | 8/2011 |

(Continued)

*Primary Examiner* — Ly D Pham
(74) *Attorney, Agent, or Firm* — McDermott Will & Emery LLP

(57) ABSTRACT

A semiconductor device includes a memory cell; circuitry that generates a reference voltage; and a sense amplifier including a first input terminal electrically connected to the memory cell, and a second input terminal electrically connected to the circuitry. The sense amplifier obtains a value in correlation with a resistance value of the memory cell based on a comparison between a sense voltage applied to the first input terminal and the reference voltage applied to the second input terminal. The sense voltage changes at a speed in correlation with the resistance value of the memory cell. In at least part of a period during which the sense voltage changes, the circuitry causes the reference voltage to change in a direction opposite to a direction in which the sense voltage changes.

18 Claims, 19 Drawing Sheets

(56) References Cited

FOREIGN PATENT DOCUMENTS

| | | |
|---|---|---|
| JP | 2011-253596 | 12/2011 |
| JP | 2014-238897 | 12/2014 |
| WO | 2006/085459 | 8/2006 |

504

501

535

SEMICONDUCTOR DEVICE INCLUDING MEMORY CELL AND SENSE AMPLIFER, AND IC CARD INCLUDING SEMICONDUCTOR DEVICE

BACKGROUND

1. Technical Field

The present disclosure relates to a semiconductor device.

2. Description of the Related Art

Japanese Unexamined Patent Application Publication No. 2014-238897 discloses a variable resistance nonvolatile memory device including a memory cell array in which a plurality of memory cells is arranged in a matrix; a selection circuit that selects any one of the memory cells; and a read circuit that reads the resistance value of a selected memory cell.

SUMMARY

A semiconductor device according to an aspect of the present disclosure includes: a memory cell; circuitry that generates a reference voltage; and a sense amplifier including a first input terminal electrically connected to the memory cell, and a second input terminal electrically connected to the circuitry. The sense amplifier obtains a value in correlation with a resistance value of the memory cell based on a comparison between a sense voltage applied to the first input terminal and the reference voltage applied to the second input terminal, the sense voltage changing at a rate in correlation with the resistance value of the memory cell. In at least part of a period during which the sense voltage changes, the circuitry changes the reference voltage in a direction opposite to a direction in which the sense voltage changes.

It should be noted that comprehensive or specific embodiments may be implemented as a system, a method, an integrated circuit, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
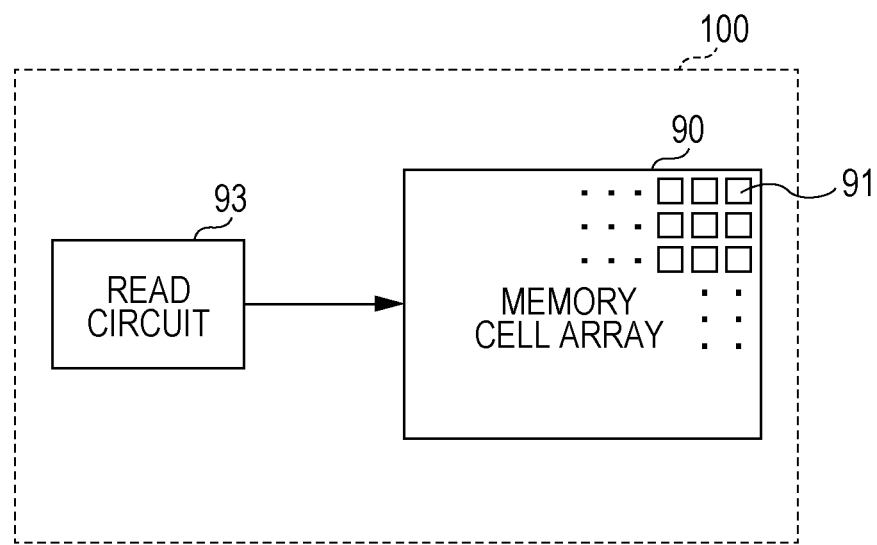
FIG. 1 is a diagram illustrating an example of a schematic configuration of a semiconductor device according to a first embodiment.

Hereinafter, a specific example of the present embodiment will be described with reference to the drawings. The numerical values, shapes, materials, composition, components, arrangement and topology of the components, steps, and order of the steps that are depicted in the following embodiments are examples. The present disclosure is not limited by those attributes. In the following embodiments, the components thereof, which are not described in the independent claim that defines the most generic concept of the present disclosure, are regarded as optional components. In the drawings, description of the components labeled with the same symbol may be omitted. Since each of the components is schematically illustrated for the purpose of facilitating understanding, the shape and dimension ratio may not reflect accurate values.

First Embodiment

1. Entire Configuration

FIG. 1 illustrates an example of a schematic configuration of a semiconductor device according to a first embodiment.

In the example illustrated in FIG. 1, a semiconductor device 100 in the present embodiment includes a memory cell array 90 and a read circuit 93.

The memory cell array 90 has a configuration in which a plurality of memory cells 91 is disposed in an array. It is to be noted that the semiconductor device in the present embodiment may not include a plurality of memory cells, and may include, for example, only a single memory cell.

The read circuit 93 obtains information on resistance value from the memory cells 91. For example, a selection circuit (not illustrated) selects one of the memory cells 91 in the memory cell array 90, and then the read circuit 93 obtains information on the resistance value of the selected memory cell 91.

The information on a resistance value refers to a value in correlation with the resistance value. The information on a resistance value is, for example, a value that increases or decreases in accordance with the increase or decrease of the resistance value. This value may be, for example, a discharge time of a capacitor connected to a memory cell in series or in parallel, and may be a count value corresponding to the discharge time. In this case, it is to be noted that the capacitor is not limited to a device, and may be wiring having parasitic capacitance, for example. The information on a resistance value is, for example, a value that is greater than or equal to 2 bits. The information on a resistance value may be, for example, a value that is greater than or equal to 3 bits.

2. Memory Cell

Each of the memory cells 91 includes a variable resistance memory element. The memory cell 91 may further include a selection element such as a transistor or a diode. In this case, the variable resistance memory element and the selection element are connected.

Figure 2:
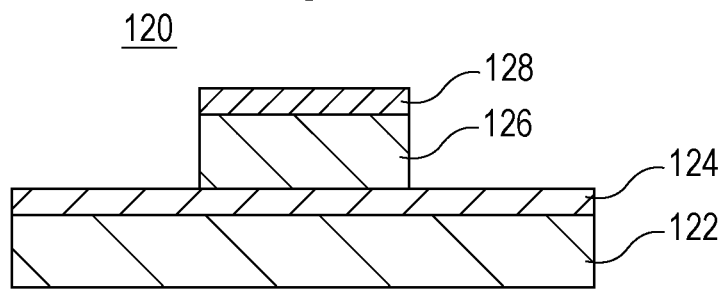
FIG. 2 is a sectional view illustrating an example of a schematic configuration of a variable resistance memory element.

FIG. 2 is a sectional view illustrating an example of a schematic configuration of a variable resistance memory element. In the example illustrated in FIG. 2, the variable resistance memory element 120 includes a base layer 122, a first electrode 124, a variable resistance layer 126, and a second electrode 128.

Examples of materials for the first electrode 124 and the second electrode 128 include iridium (Ir), platinum (Pt), tungsten (W), copper (Cu), aluminum (Al), titanium nitride (TiN), tantalum nitride (TaN), and titanium aluminum nitride (TiAlN). The shape and size of the first electrode 124 and the second electrode 128 are not limited to those of the example illustrated in FIG. 2. For example, the first electrode 124 may be part of wiring. The first electrode 124 and the second electrode 128 may be formed in an optimal shape as needed according to a semiconductor manufacturing process. The base layer 122 may be omitted or modified according to a semiconductor manufacturing process.

The variable resistance layer 126 may be a metal oxide layer. The variable resistance layer 126 may be an oxygen-deficient metal oxide layer. The metal oxide of which the variable resistance layer 126 is composed may be at least one of transition metal oxide and aluminum oxide. Examples of transition metal oxide include tantalum oxide, titanium oxide, hafnium oxide, zirconium oxide, niobium oxide, tungsten oxide, nickel oxide, and iron oxide. A transition metal may be in one of multiple oxidation states, and thus may change to a different resistance state by a redox reaction.

The variable resistance layer 126 may be a stacked body including a first variable resistance layer connected to the first electrode 124 and a second variable resistance layer connected to the second electrode 128. The variable resistance layer 126 may include, for example, the first variable resistance layer having a composition expressed by $TaO_x$ (where $0 \le x \le 2.5$) and the second variable resistance layer having a composition expressed by $TaO_y$ (where $x \le y \le 2.5$). $TaO_x$ may further satisfy $0.8 \le x \le 1.9$. $TaO_y$ may further satisfy $2.1 \le y \le 2.5$. The thickness of a second tantalum containing layer may be 1 nm or greater and 8 nm or less.

The resistance value of the variable resistance memory element 120 is changed reversibly between a high resistance range in a high resistance state and a low resistance range in a low resistance state by an electrical signal applied across the first electrode 124 and the second electrode 128. For example, the high resistance range may be set to $5 \times 10^4 \Omega$ or higher and $2 \times 10^6 \Omega$ or lower, and the low resistance range may be set to $5 \times 10^3 \Omega$ or higher and $5 \times 10^4 \Omega$ or lower.

Various configurations and variable resistance characteristics of a variable resistance memory element are described in U.S. patent application Publication Ser. No. 14/679,722 which is incorporated by reference in the present disclosure.

3. Read Circuit

Hereinafter, a read circuit according to a reference example will be described first. Next, a problem of the read circuit according to the reference example will be described. Finally, a read circuit according to the present embodiment will be described.

3-1. Reference Example

Figure 3:
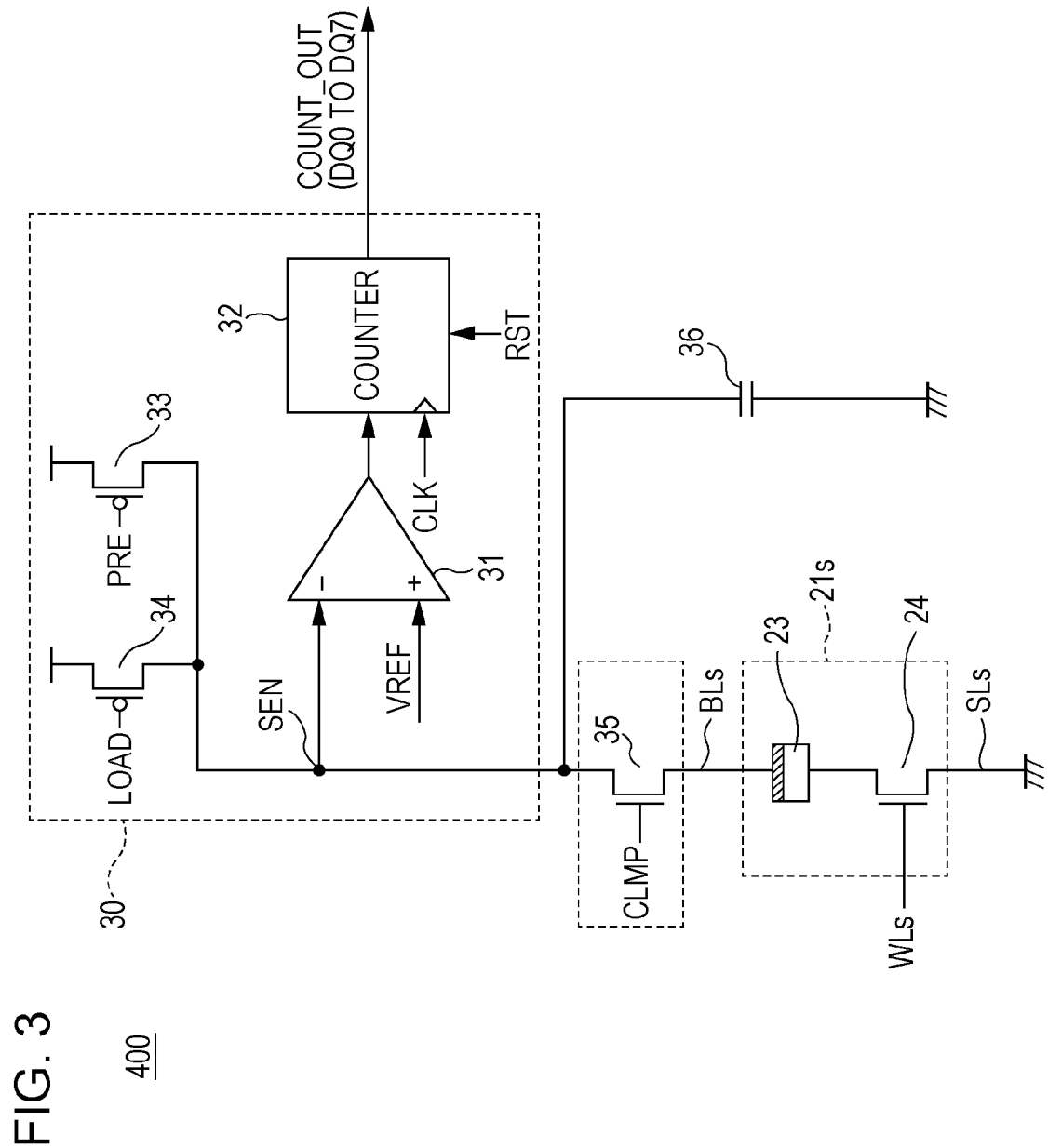
FIG. 3 is a circuit diagram illustrating the configuration of a read circuit according to a reference example.

FIG. 3 illustrates the configuration of a read circuit 400 according to a reference example.

In FIG. 3, the read circuit 400 has a sense amplifier circuit 30 using a discharge method. The sense amplifier circuit 30 includes a comparator 31, a counter 32, a PMOS transistor 33 for precharge, and a PMOS transistor 34 for load current. FIG. 3 also illustrates a memory cell 21s connected to the read circuit 400. The memory cell 21s includes a variable resistance memory element 23 and an NMOS transistor 24.

The counter 32 is connected to the output of the comparator 31. The counter 32 receives input of a reset signal RST and a clock signal CLK. The reset signal RST and clock signal CLK are inputted from, for example, a control circuit (not illustrated). When the reset signal RST becomes a low level, the count value in the counter 32 is initialized, and subsequently counting is started based on the clock signal CLK. The clock signal CLK is, for example, a rectangle wave having a constant frequency. The count value of the counter 32 is incremented by one for each rise of the clock signal CLK. When the voltage (i.e., the sense voltage) of a sense node SEN falls below a reference voltage VREF, the counter 32 stops counting and then outputs the current count value to an output terminal COUNT_OUT.

The PMOS transistor 33 has a gate terminal to which a precharge control signal PRE is inputted, a source terminal to which a power supply voltage VDD is inputted, and a drain terminal to which the sense node SEN is connected. The PMOS transistor 34 has a gate terminal to which a load control signal LOAD is inputted, a source terminal to which the power supply voltage VDD is inputted, and a drain terminal to which the sense node SEN is connected.

FIG. 3 illustrates an NMOS transistor 35 for applying a clamp voltage. The NMOS transistor 35 is an example of a clamp circuit. The NMOS transistor 35 includes a gate terminal to which a clamp control signal CLMP is inputted, a source terminal (or a drain terminal) to which the sense node SEN is connected, and a drain terminal (or a source terminal) to be connected to a memory cell selected by a column decoder circuit (not illustrated).

FIG. 3 illustrates a capacitor 36, one end of which is connected to GND, and the other end of which is connected equipotentially to the sense node SEN.

Figure 4:
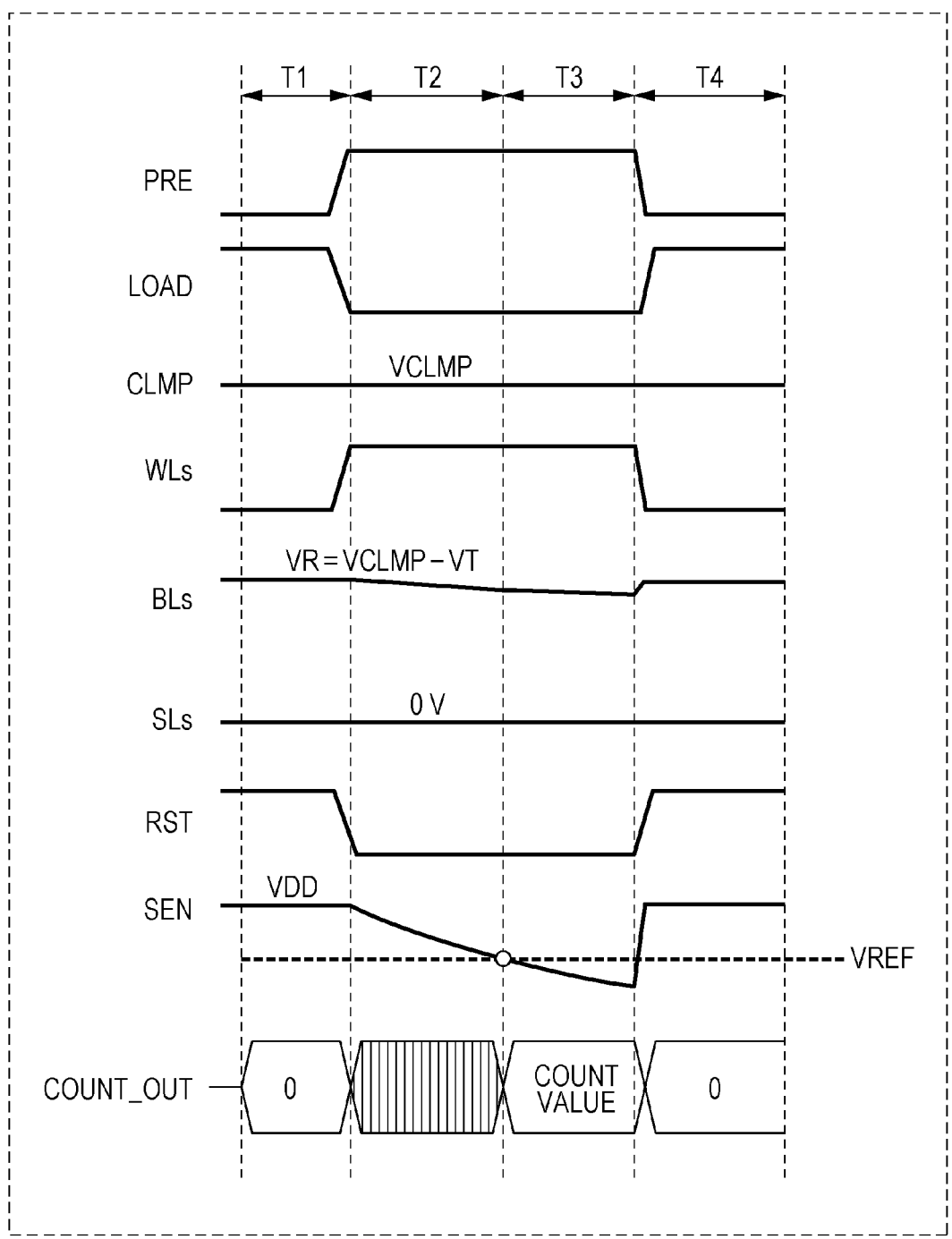
FIG. 4 is a timing chart for a read operation using a discharge method according to a reference example.

FIG. 4 illustrates a timing chart in the case where the read circuit 400 reads information on the resistance value of the selected memory cell 21s by the discharge method.

During a precharge period T1, the precharge control signal PRE is in a low level and the PMOS transistor 33 is in an ON state. On the other hand, the load control signal LOAD is in a high level and the PMOS transistor 34 is in an OFF state. The potential of a selection word line WLs is in a low level and the NMOS transistor 24 is in an OFF state. A gate voltage VCLMP is applied to the gate terminal of the NMOS transistor 35. Thus, the potential of a selection bit line BLs is precharged to the voltage (VCLMP−VT) which is the value obtained by subtracting threshold value VT of the NMOS transistor 35 from the gate voltage VCLMP of the NMOS transistor 35. A selection source line SLs is fixed to GND. The sense node SEN is precharged to the power supply voltage VDD. The control signal RST of the counter 32 is in a high level, and thereby the counter 32 outputs the fixed value '0' from the output terminal COUNT_OUT.

During a sense period T2, the precharge control signal PRE is in a high level and the PMOS transistor 33 is in an OFF state. On the other hand, the load control signal LOAD is in a low level and the PMOS transistor 34 is in an ON state. The potential of the selection word line WLs is in a high level and the NMOS transistor 24 is in an ON state. A voltage is applied from the selection bit line BLs to the selection source line SLs via the selected memory cell 21s, and thereby discharge from the sense node SEN and the selection bit line BLs is started. The control signal RST becomes a low level simultaneously with the start of the discharge, and thereby the counter 32 starts to count. The comparator 31 compares the voltage of the sense node SEN with the reference voltage VREF for each count. The counter 32 continues to increment the count value until the voltage of the sense node SEN falls below the reference voltage VREF. The higher the resistance value of the memory cell 21s at the time of reading is, the longer the discharge time is and the larger the count value is.

When the voltage of the sense node SEN falls below the reference voltage VREF, latch period T3 starts. In the latch period T3, the count value of the counter 32 when the voltage of the sense node SEN falls below the reference voltage VREF is held in a latch (not illustrated). The count value held is outputted from the output terminal COUNT_OUT. The count value represents information on the resistance value of the memory cell 21s.

During reset period T4, the potential of the selection word line WLs is in a low level and the NMOS transistor 24 of the selected memory cell 21s is OFF. Thus, the read operation is completed.

It is to be noted that the discharge time is adjustable by regulating the capacitance of the capacitor 36. The higher the capacitance of the capacitor 36 is, the longer the discharge time of the sense node SEN is and the larger the outputted count value is. Conversely, the lower the capacitance of the capacitor 36 is, the shorter the discharge time of the sense node SEN is and the smaller the outputted count value is.

The capacitor 36 may be effectively used, for example, when it is desired to improve the detection accuracy in a region where the discharge time is short, in other words, the detection accuracy in a region where the memory cell 21s has a low resistance. For example, when the memory cell 21s has a low resistance and the discharge time is short comparable to the time interval between counts (i.e., the period of the clock signal CLK), it is difficult to detect a difference between resistance values in terms of a difference between count values. Thus, when the capacitance load of the capacitor 36 is imposed on the sense node SEN, it is possible to delay the discharge and thus the discharge time is adjustable to a level that allows a difference between resistance values to be detected.

It is to be noted that in the case of the discharge method, in principle, the higher the resistance value of the memory cell 21s is, the longer the discharge time is and the smaller the amount of discharge per unit time is. Therefore, the sensitivity of the count value to a difference between resistance values, in other words, the resolution of the resistance value is improved as the resistance value of the selected memory cell 21s increases. Consequently, the discharge method allows information on the resistance value with high accuracy to be obtained in a region with a high resistance.

Figure 5:
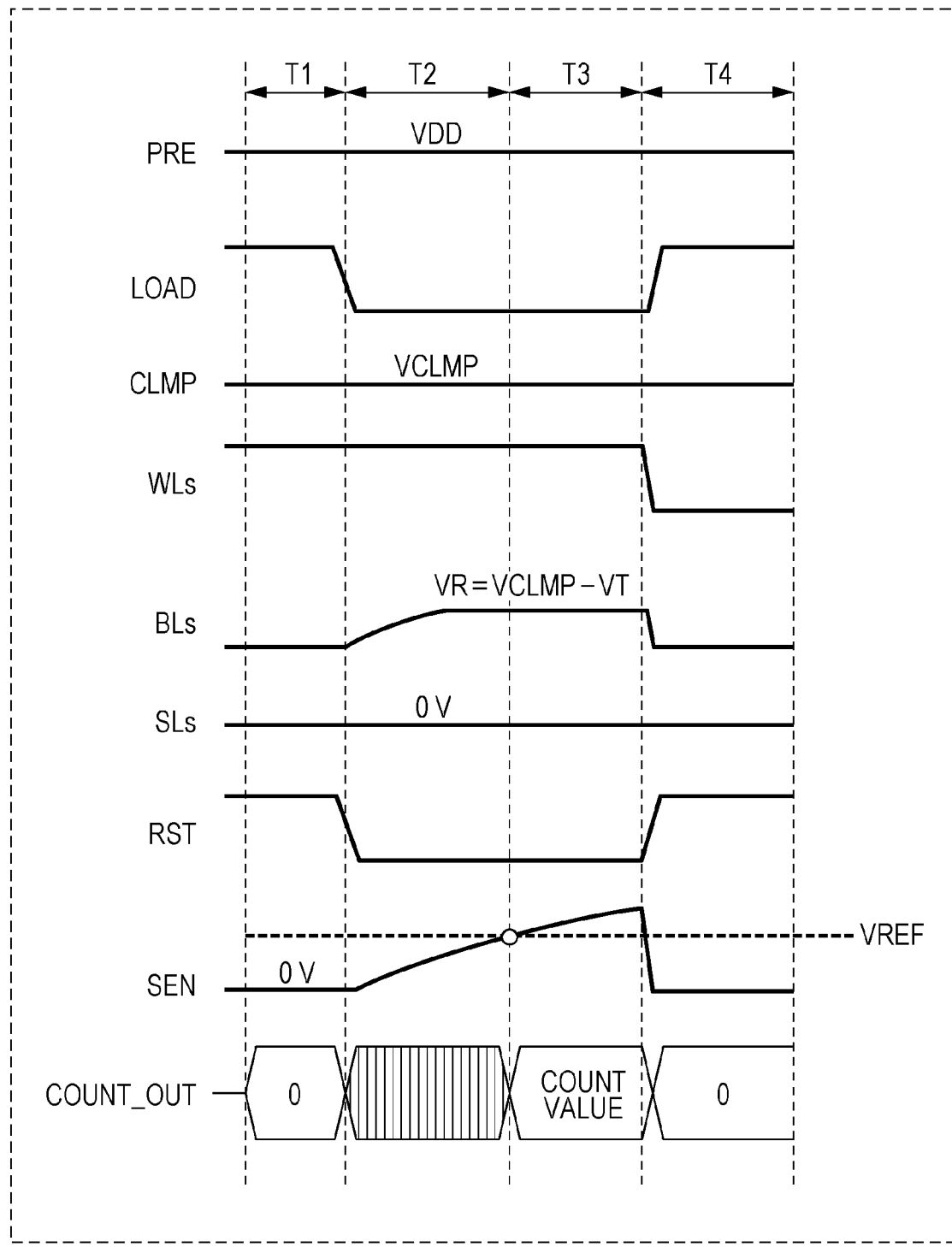
FIG. 5 is a timing chart for a read operation using a charge method according to a reference example.

FIG. 5 illustrates a timing chart in the case where the read circuit 400 reads information on the resistance value of the selected memory cell 21s by a charge method.

During the discharge period T1, the precharge control signal PRE and the load control signal LOAD are in a high level and the PMOS transistor 33 and the PMOS transistor 34 are in an OFF state. The gate voltage VCLMP is applied to the gate terminal of the NMOS transistor 35. The potential of the selection word line WLs is in a high level and the NMOS transistor 24 is in an ON state. Thus, the sense node SEN and the selection bit line BLs are connected to GND (0V) via the variable resistance memory element 23, and those potentials are discharged to the GND level. The control signal RST of the counter 32 is set to a high level, and the counter 32 outputs the fixed value '0' from the output terminal COUNT_OUT.

During the sense period T2, the load control signal LOAD is in a low level and the PMOS transistor 34 is in an ON state. Thus, a current path is formed through the PMOS transistor 34, the NMOS transistor 35, and the selected memory cell 21s, and thereby charge to the sense node SEN and the selection bit line BLs starts. The control signal RST becomes a low level simultaneously with the start of the charge, and thereby the counter 32 starts to count. The comparator 31 compares the voltage of the sense node SEN with the reference voltage VREF for each count. The counter 32 continues to increment the count value until the voltage of the sense node SEN exceeds the reference voltage VREF. The lower the resistance value of the memory cell 21s at the time of reading is, the longer the charge time is and the larger the count value is.

When the voltage of the sense node SEN exceeds the reference voltage VREF, the latch period T3 starts. In the latch period T3, the count value of the counter 32 when the voltage of the sense node SEN exceeds the reference voltage VREF is held in a latch (not illustrated). The count value held is outputted from the output terminal COUNT_OUT. The count value represents information on the resistance value of the memory cell 21s.

During reset period T4, the potential of the selection word line WLs is in a low level and the NMOS transistor 24 of the selected memory cell 21s is OFF. Thus, the read operation is completed.

It is to be noted that the charge time is adjustable by regulating the capacitance of the capacitor 36. Detailed description is the same as the description of the discharge method and thus is omitted. In the case of the charge method, in principle, the lower the resistance value of the selected memory cell 21s is, the longer the charge time is and the smaller the amount of charge per unit time is. Therefore, the sensitivity of the count value to a difference between resistance values, in other words, the resolution of the resistance value is improved as the resistance value of the selected memory cell 21s decreases. Consequently, the charge method allows information on the resistance to be obtained with high accuracy in a region with a low resistance.

With the configuration of FIG. 3, both the discharge method and the charge method may be used. For example, when information on the resistance value is obtained from a memory cell having a relatively high resistance, the discharge method may be adopted. When information on the resistance value is obtained from a memory cell having a relatively low resistance, the charge method may be adopted. Information on the resistance value is obtainable by these methods with high accuracy. Conversely, when information on the resistance value is obtained from a memory cell having a relatively high resistance, the charge method may be adopted. When information on the resistance value is obtained from a memory cell having a relatively low resistance, the discharge method may be adopted. These methods allow the number of bits of the counter to be decreased and the circuit size to be reduced.

It is to be noted that the resolution of the reading is adjustable by the amount of current in the PMOS transistor 34, the frequencies of the clock signal CLK inputted to the counter 32, the magnitude of the reference voltage VREF, and/or the capacitance of the capacitor 36. For example, when the frequencies of the clock signal CLK increase, the resolution of the reading improves.

In the discharge method, the read circuit 400 may be set so that a relatively high resistance value is read in a short time. Such a setting may be achieved, for example, by increasing the reference voltage VREF, decreasing the amount of current in the PMOS transistor 34, and/or reducing the capacitance of the capacitor 36. Conversely, the read circuit 400 may be set so that a relatively low resistance value is read in a short time. Such a setting may be achieved, for example, by decreasing the reference voltage VREF, increasing the amount of current in the PMOS transistor 34, and/or increasing the capacitance of the capacitor 36.

3-2. Problem in Reference Example

The inventors have found the following problem in the read circuit 400 according to the above-described reference example.

Figure 6:
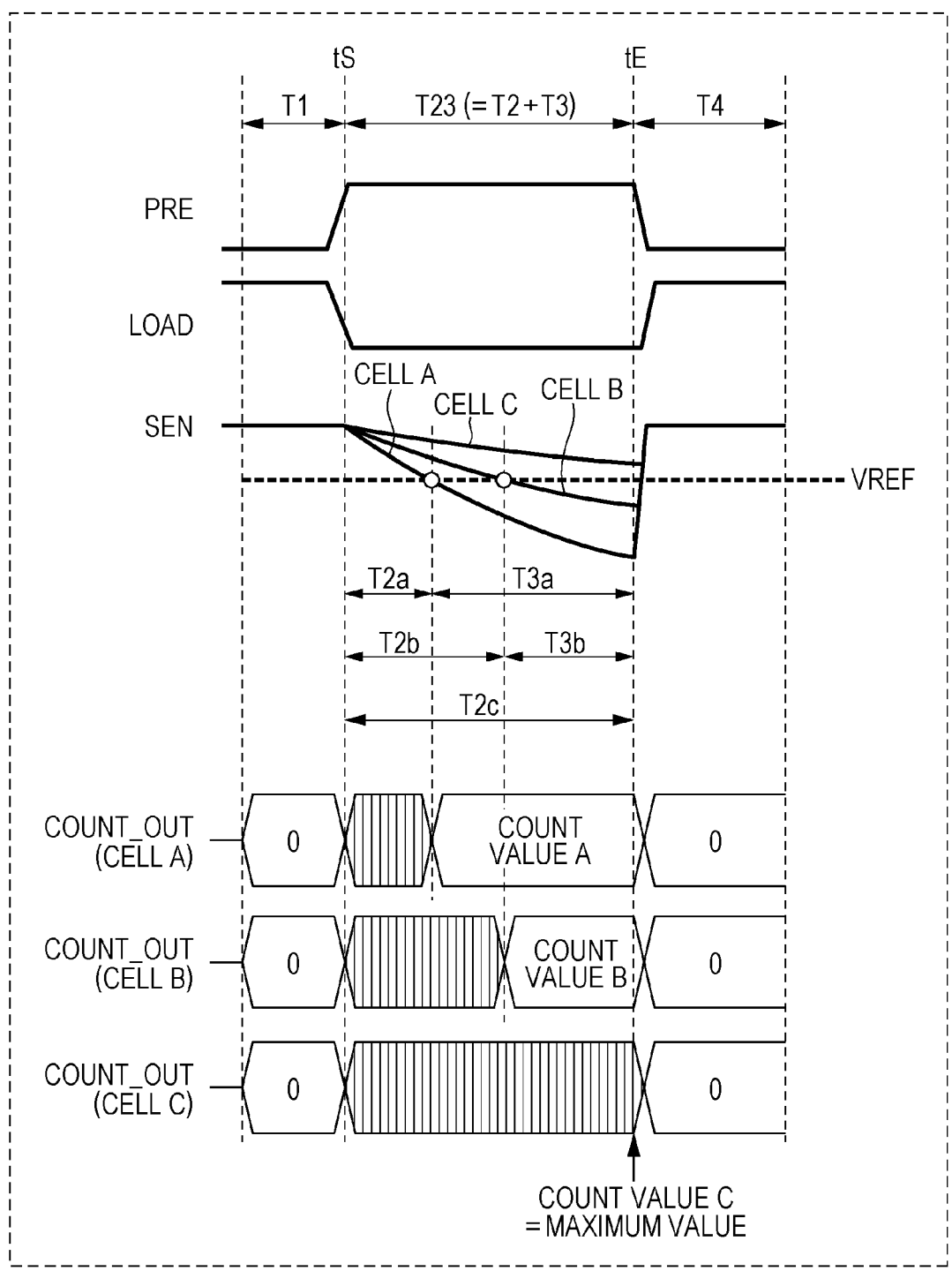
FIG. 6 is a timing chart for a read operation using the discharge method according to a reference example.

FIG. 6 illustrates a timing chart when the read circuit 400 reads information on the resistance value of the memory cells A to C having different resistance values, by the discharge method. Hereinafter, the memory cells A to C may be simply referred to as the cells A to C.

FIG. 6 illustrates the voltage of the sense node SEN and the count value when information on the resistance values of the cells A to C is read. The cell A is, for example, the memory cell having the lowest resistance value out of the memory cells of the memory cell array 90. The cell C is, for example, the memory cell having the highest resistance value out of the memory cells of the memory cell array 90. The cell B is, for example, a memory cell that has a resistance value which is higher than that of the memory cell A and which is lower than that of the memory cell C.

Similarly to FIG. 4, at timing tS when the precharge period T1 ends and the sense period T2 starts, the precharge control signal PRE changes from a low level to a high level, and the load control signal LOAD changes from a high level to a low level. Also, at the timing tS, the counter 32 starts to count.

Since the cell A has the lowest resistance value, the speed of voltage drop at the sense node SEN in reading the cell A is the highest. The voltage of the sense node SEN falls below the reference voltage VREF at the time when time T2a has elapsed since the time tS. Thus, the output signal of the comparator 31 changes, and thereby the counter 32 stops counting. A count value A at this point is outputted from the output terminal COUNT_OUT. Consequently, the resistance value of the cell A is converted to the count value A.

Since the cell B has a resistance value which is higher than that of the cell A and which is lower than that of the cell C, the voltage of the sense node SEN in reading the cell B falls below the reference voltage VREF at the time when time T2b has elapsed since the time tS. Thus, the output signal of the comparator 31 changes, and thereby the counter 32 stops counting. A count value B at this point is outputted from the output terminal COUNT_OUT. Consequently, the resistance value of the cell B is converted to the count value B.

Since the cell C has the highest resistance value, the voltage of the sense node SEN in reading the cell C is higher than the reference voltage VREF even at time tE at which reading is supposed to be terminated. At this point, the count value C of the counter 32 reaches a maximum value. Consequently, the resistance value of the cell C is not appropriately converted to a count value, and the read operation is completed.

Figure 7:
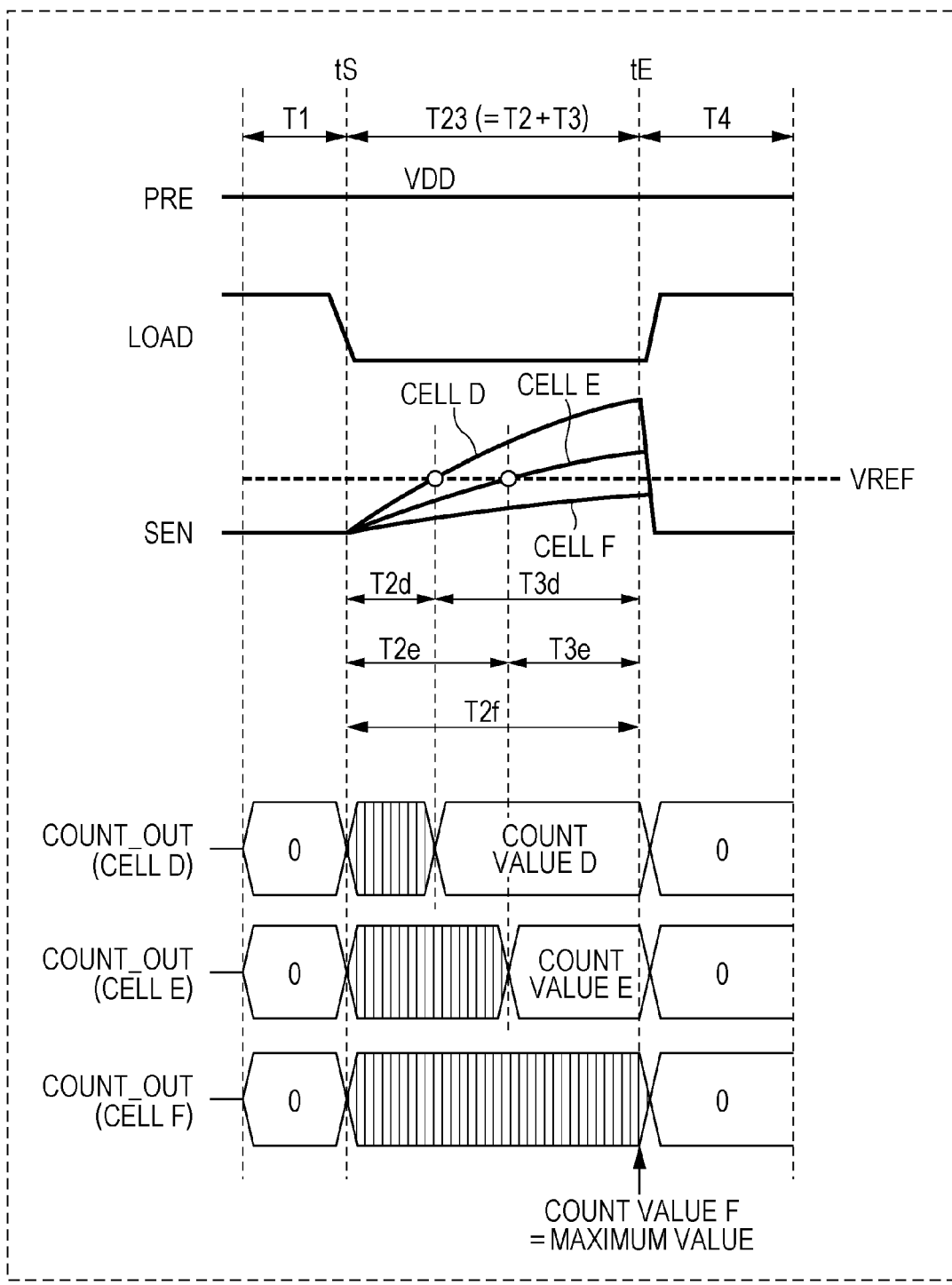
FIG. 7 is a timing chart for a read operation using the charge method according to a reference example.

FIG. 7 illustrates a timing chart when the read circuit 400 reads information on the resistance value of the memory cells D to F having different resistance values, by the charge method. Hereinafter, the memory cells D to F may be simply referred to as the cells D to F.

FIG. 7 illustrates the voltage of the sense node SEN and the count value when information on the resistance values of the cells D to F is read. The cell D is, for example, the memory cell having the highest resistance value out of the memory cells of the memory cell array 90. The cell F is, for example, the memory cell having the lowest resistance value out of the memory cells of the memory cell array 90. The cell E is, for example, a memory cell that has a resistance value which is lower than that of the memory cell D and which is higher than that of the memory cell F.

Similarly to FIG. 5, at timing tS when the discharge period T1 ends and the sense period T2 starts, the load control signal LOAD changes from a high level to a low level and the counter 32 starts to count.

Since the cell D has the highest resistance value, the speed of voltage increase at the sense node SEN in reading the cell D is the highest. The voltage of the sense node SEN exceeds the reference voltage VREF at the time when time T2d has elapsed since the time tS. Thus, the output signal of the comparator 31 changes, and thereby the counter 32 stops counting. A count value D at this point is outputted from the output terminal COUNT_OUT. Consequently, the resistance value of the cell D is converted to the count value D.

Since the cell E has a resistance value which is lower than that of the cell D and which is higher than that of the cell F, the voltage of the sense node SEN in reading the cell E exceeds the reference voltage VREF at the time when time T2e has elapsed since the time tS. Thus, the output signal of the comparator 31 changes, and thereby the counter 32 stops counting. A count value E at this point is outputted from the output terminal COUNT_OUT. Consequently, the resistance value of the cell E is converted to the count value E.

Since the cell F has the lowest resistance value, the voltage of the sense node SEN in reading the cell F is lower than the reference voltage VREF even at time tE at which reading is supposed to be terminated. At this point, the count value F of the counter 32 reaches a maximum value. Consequently, the resistance value of the cell F is not appropriately converted to a count value, and the read operation is completed.

As described with reference to FIGS. 6 and 7, the resistance values of the cell C and the cell F are not appropriately converted to count values. For example, in the discharge method, any resistance values above a certain level are converted to the same value (i.e., a maximum value of the count value) regardless of the time taken for the voltage of the sense node SEN to fall below the reference voltage VREF, because the time is longer than time T23. Therefore, a difference between resistance values is not detectable by the discharge method in a region with a high resistance. Similarly, in the charge method, any resistance values below a certain level are converted to the same value (i.e., a maximum value of the count value) regardless of the time taken for the voltage of the sense node SEN to exceed the reference voltage VREF, because the time is longer than the time T23. Therefore, a difference between resistance values is not detectable by the charge method in a region with a low resistance.

In order to solve this problem, an approach of increasing the time T23, the time between tS and tE, in reading may be taken. However, in this approach, the time taken for one read cycle is increased.

As another approach, the time taken for the voltage of the sense node SEN to exceed or fall below the reference voltage VREF may be overall shortened. This may be achieved, for example, by decreasing the capacitance of the capacitor 36, or adjusting the amount of current in the PMOS transistor 34 and/or the reference voltage VREF. However, in this case, the accuracy of detection of the resistance values of the cell A and the cell D is reduced. For example, in the discharge method, when the time taken for the voltage of the sense node SEN to fall below the reference voltage VREF becomes short comparable to the time interval between counts (i.e., the period of the clock signal CLK), it is difficult to detect a difference between resistance values in terms of a difference between count values. In other words, in the discharge method, the accuracy of detection of a difference between resistance values in a region with a low resistance is reduced. Similarly, in the charge method, when the time taken for the voltage of the sense node SEN to exceed the reference voltage VREF becomes short comparable to the time interval between counts (i.e., the period of the clock signal CLK), it is difficult to detect a difference between resistance values in terms of a difference between count values. In other words, in the charge method, the accuracy of detection of a difference between resistance values in a region with a high resistance is reduced.

Due to the above reasons, in the read circuit 400 according to the reference example, there is a trade-off relationship between detection of a resistance value with high accuracy over a wide range including a region with a low resistance and a region with a high resistance, and execution of single read in a short time. This problem is serious, for example, when resistance values, which are distributed over a wide range, of a plurality of memory cells have to be read with high accuracy, or a resistance value, which fluctuates in a wide range with time, of a memory cell has to be read at a plurality of timings with high accuracy.

For example, a case may be assumed in which random numbers are generated using a statistical variation of the resistance values of memory cells. In this case, for example, a read circuit obtains a plurality of pieces of information on resistance value from a plurality of memory cells, and then a random number generation circuit generates random numbers based on the variation in the pieces of information on resistance value. The details of such a random number generation method are described in U.S. patent application Publication Ser. No. 14/711,785 which is incorporated by reference in the present disclosure. In this case, it is desirable that a variation of the resistance values of memory cells be reflected with sufficient accuracy by pieces of information (e.g., count values) on resistance value obtained by a read circuit.

For example, a case may be assumed in which random numbers are generated using a random fluctuation of the resistance value of a memory cell over time. In this case, for example, a read circuit obtains information on the resistance value of a memory cell at multiple timings, and then a random number generation circuit generates random numbers based on those pieces of information on resistance value. The details of such a random number generation method are described in U.S. patent application Publication Ser. No. 14/679,722 which is incorporated by reference in the present disclosure. In this case, it is desirable that a slight fluctuation in the resistance value be detected with high accuracy as the information (e.g., count values) on resistance value regardless of the magnitude of the resistance value of the memory cell.

Hereinafter, a read circuit and/or a read method will be described that are capable of reading resistance values with high accuracy and in a short time even over a wide range including a region with a low resistance and a region with a high resistance.

3-3. Read Circuit

Figure 8:
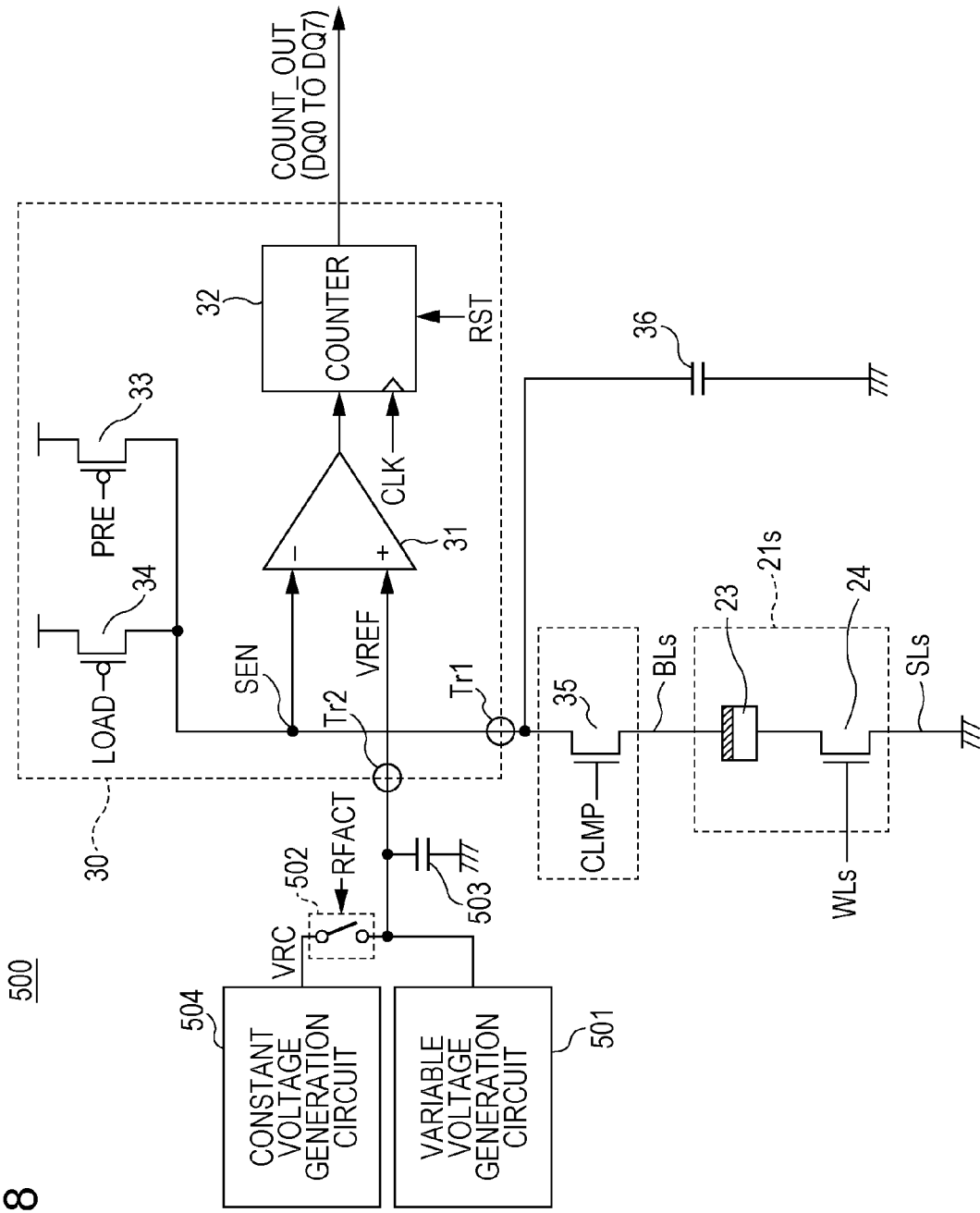
FIG. 8 is a circuit diagram illustrating an example of a schematic configuration of a read circuit according to the first embodiment.

FIG. 8 illustrates an example of a read circuit 500 according to the present embodiment. Description of the components which are of the read circuit 500 illustrated in FIG. 8 and which are in common with the read circuit 400 illustrated in FIG. 3 is omitted.

In addition to the various components illustrated in FIG. 3, the read circuits 500 further includes a constant voltage generation circuit 504, a variable voltage generation circuit 501, a switch circuit 502 and a capacitor 503. The circuit including the constant voltage generation circuit 504, the variable voltage generation circuit 501, and the switch circuit 502 is an example of the "circuitry that generates a reference voltage" in the present disclosure.

The constant voltage generation circuit 504 generates a constant voltage. The variable voltage generation circuit 501 generates a voltage which varies with time. The switch circuit 502 connects or disconnects the output terminal of the constant voltage generation circuit 504 and a reference node in response to control signal RFACT inputted from a logic control circuit (not illustrated), for example. The capacitor 503 is connected to the reference node.

The sense amplifier circuit 30 further includes a terminal Tr1 and a terminal Tr2. The terminal Tr1 is electrically connected to one end of the selected memory cell 21s. The terminal Tr2 is electrically connected to the circuitry that generates a reference voltage and serves as the reference node.

Figure 9:
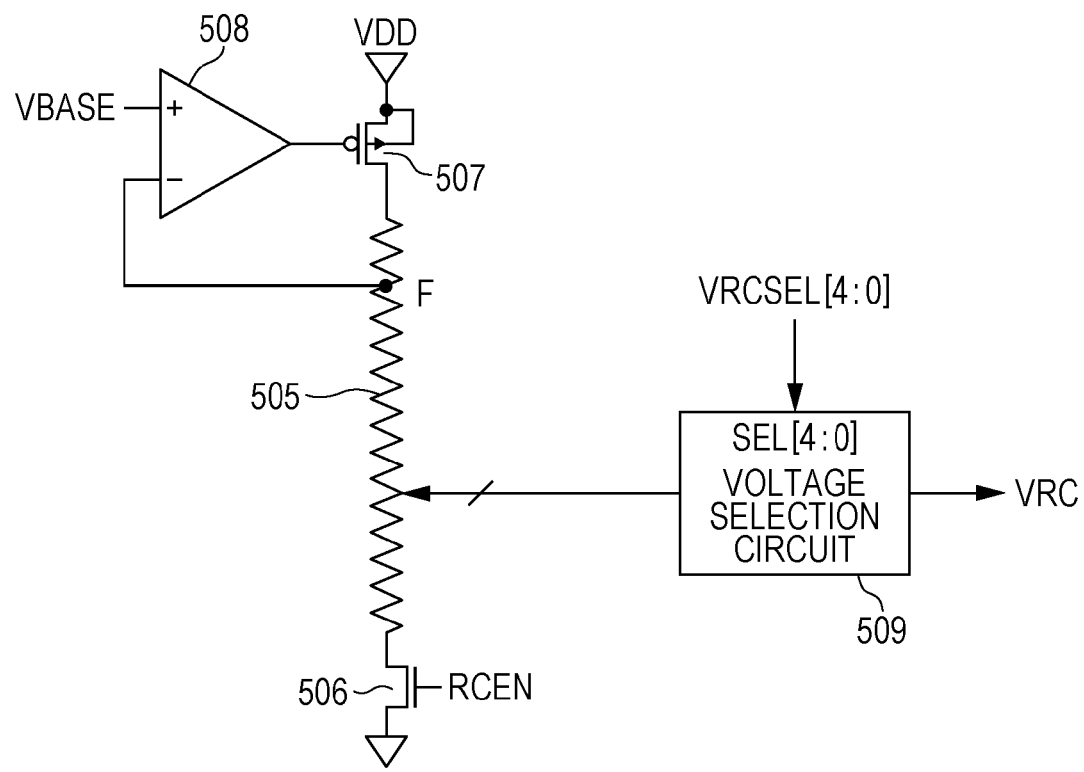
FIG. 9 is a circuit diagram illustrating a configuration example of a constant voltage generation circuit according to the first embodiment.

FIG. 9 illustrates a configuration example of the constant voltage generation circuit 504.

In this example, the constant voltage generation circuit 504 has a divider resistor 505, an N-channel transistor 506, a P-channel transistor 507, a differential amplifier 508, and a voltage selection circuit 509.

The divider resistor 505 is formed of polysilicon, for example. The divider resistor 505 has, for example, 32 output terminals and outputs 32 types of divided voltages through the terminals. One end of the divider resistor 505 is connected to the drain terminal of the N-channel transistor 506.

The source terminal of the N-channel transistor 506 is connected to the ground. The gate terminal of the N-channel transistor 506 is connected to, for example, a logic control circuit (not illustrated), and receives input of an enable signal RCEN.

The source terminal of the P-channel transistor 507 receives input of the power supply voltage VDD. The drain terminal of the P-channel transistor 507 is connected to the other end of the divider resistor 505. The gate terminal of the P-channel transistor 507 is connected to the output terminal of the differential amplifier 508.

The positive input terminal of the differential amplifier 508 receives input of reference voltage VBASE. The negative input terminal of the differential amplifier 508 is connected to an intermediate node F point of the divider resistor 505.

The voltage selection circuit 509 receives input of 32 types of divided voltages from 32 output terminals of the divider resistor 505. The voltage selection circuit 509 selects one of those divided voltages according to selection signal VRCSEL [4:0], and thus outputs the one divided voltage as an output voltage VRC from the output terminal.

When the constant voltage generation circuit 504 is driven, the voltage at the intermediate node F point of the divider resistor 505 is controlled to be the same as the reference voltage VBASE, for example, by the P-channel transistor 507 and the differential amplifier 508. Thus, even when the power supply voltage VDD varies, the output voltage VRC is selectable by the voltage selection circuit 509 based on the reference voltage VBASE.

Figure 10:
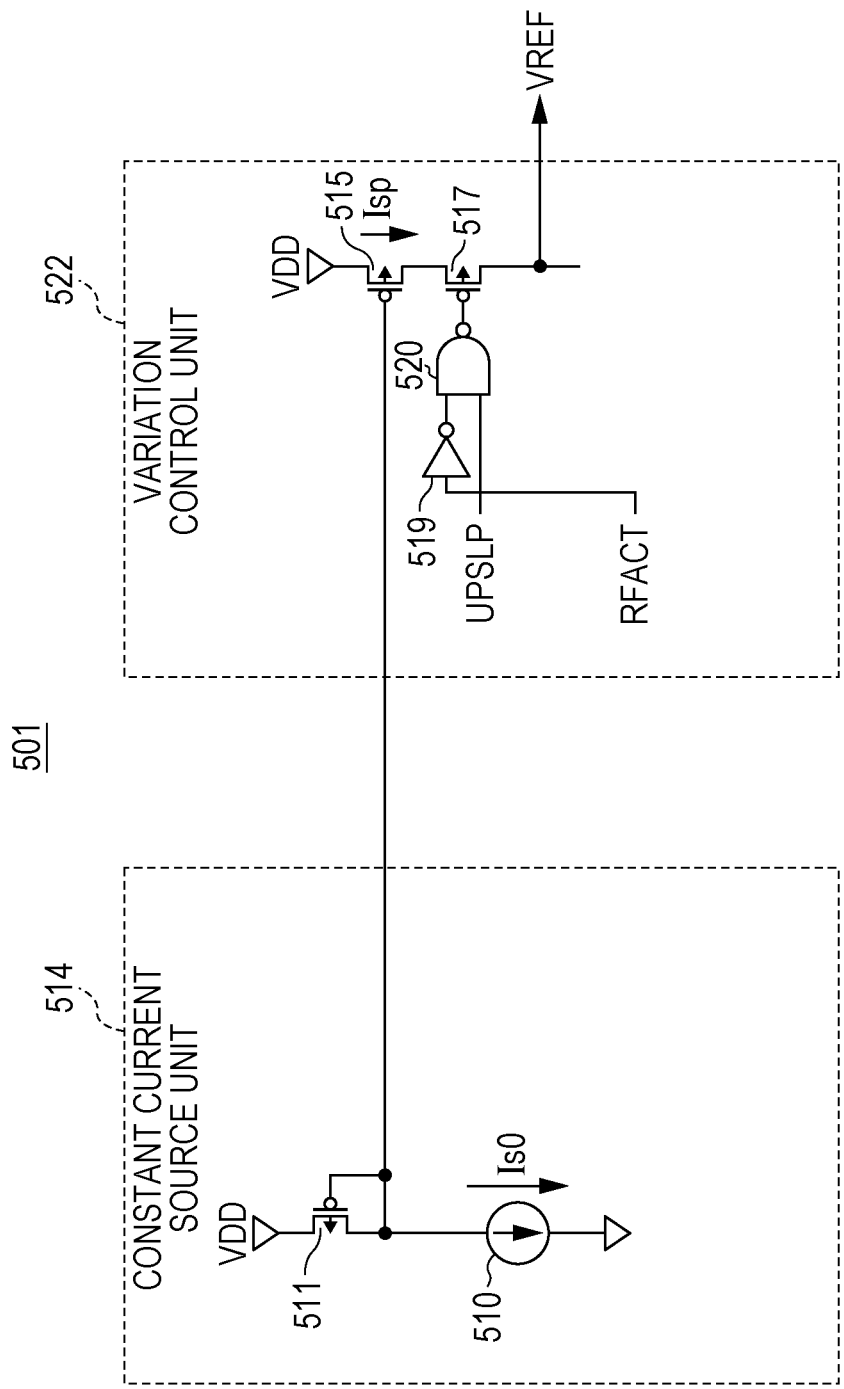
FIG. 10 is a circuit diagram illustrating a first configuration example of a variable voltage generation circuit according to the first embodiment.

FIG. 10 illustrates a first configuration example of the variable voltage generation circuit 501. The variable voltage generation circuit 501 illustrated in FIG. 10 is an up-slope type circuit that increases the reference voltage VREF with lapse of time.

In an overall configuration, the variable voltage generation circuit 501 has a constant current source unit 514 and a variation control unit 522.

The constant current source unit 514 has a constant current source 510 and a P-channel transistor 511. The constant current source 510 generates a constant current Is0. The source terminal of the P-channel transistor 511 receives input of the power supply voltage VDD. The drain terminal and the source terminal of the P-channel transistor 511 are connected to the constant current source 510.

The variation control unit 522 has a P-channel transistor 515, a P-channel transistor 517, a NOT gate 519, and a NAND gate 520. The source terminal of the P-channel transistor 515 receives input of the power supply voltage VDD. The drain terminal of the P-channel transistor 515 is connected to one of the drain terminal and the source terminal of the P-channel transistor 517. The gate terminal of the P-channel transistor 515 is connected to the drain terminal and the gate terminal of the P-channel transistor 511 in a current mirror configuration. The gate terminal of the P-channel transistor 517 is connected to the output terminal of the NAND gate 520.

When the P-channel transistor 517 is turned on, mirror current Isp flows out from the variation control unit 522 to the reference node, thereby increasing the reference voltage VREF with time. At this point, signal UPSLP, which is a signal that designates a direction in which the reference voltage VREF changes, is in a high level.

It is to be noted that the amount of current of the mirror current Isp is changeable by adjusting the mirror ratio between the P-channel transistors 511 and 515. This allows the amount of variation of the reference voltage VREF per unit time to be adjusted in any way.

Figure 11:
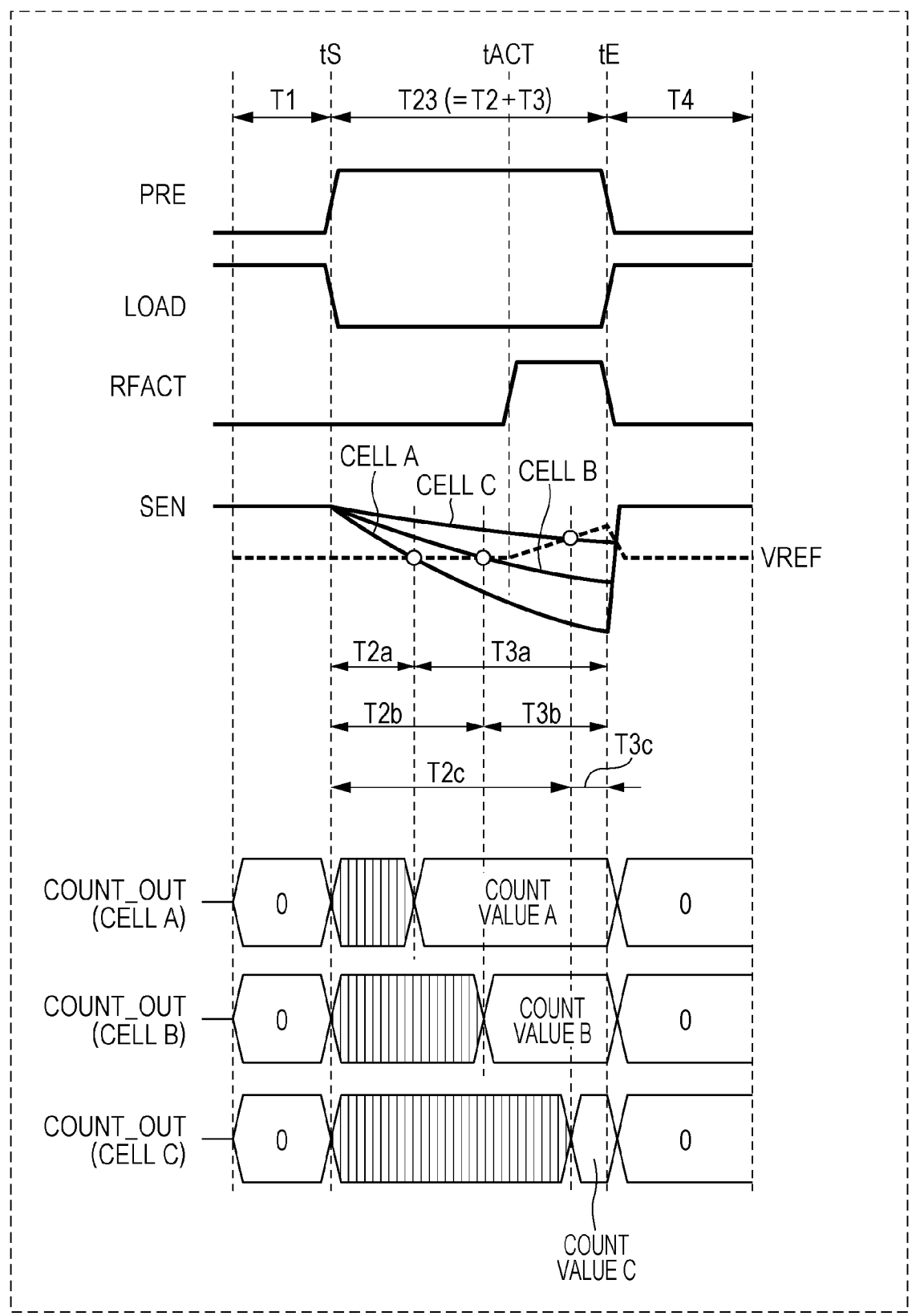
FIG. 11 is a timing chart for a read operation using a discharge method according to the first embodiment.

The operation of the read circuit 500 including the constant voltage generation circuit 504 of FIG. 9 and the variable voltage generation circuit 501 of FIG. 10 will be described with reference to the timing chart of FIG. 11. It is to be noted that description of the signals which are illustrated in FIG. 11 and which are in common with the signals illustrated in FIG. 6 is omitted.

During the precharge period T1, the control signal RFACT is in a low level, and thereby the switch circuit 502 electrically connects the constant voltage generation circuit 504 and the reference node. Thus, the reference voltage VREF is a constant voltage VRC outputted by the constant voltage generation circuit 504. At the time tS, the precharge control signal PRE changes from a low level to a high level, and the load control signal LOAD changes from a high level to a low level. Also, at the time tS, the counter 32 starts to count.

The voltage of the sense node SEN in reading the cell A falls below the reference voltage VREF at the time when time T2a has elapsed since the time tS. Thus, the output signal of the comparator 31 changes, and thereby the counter 32 stops counting. The count value A at this point is outputted from the output terminal COUNT_OUT. Consequently, the resistance value of the cell A is converted to the count value A.

The voltage of the sense node SEN in reading the cell B falls below the reference voltage VREF at the time when time T2b has elapsed since the time tS. Thus, the output signal of the comparator 31 changes, and thereby the counter 32 stops counting. The count value B at this point is outputted from the output terminal COUNT_OUT. Consequently, the resistance value of the cell B is converted to the count value B.

At time tACT, the control signal RFACT changes from a low level to a high level, and thereby the switch circuit 502 is set to OFF. This causes the output terminal of the constant voltage generation circuit 504 to be electrically disconnected from the reference node. Simultaneously, the variable voltage generation circuit 501 starts to supply charges to the reference node. Thus, the reference voltage VREF increases with time.

After that, the voltage of the sense node SEN in reading the cell C falls below the reference voltage VREF at the time when time T2c has elapsed since the time tS. Thus, before the time T23 has elapsed since the time tS, the output signal of the comparator 31 changes, and thereby the counter 32 stops counting. The count value C at this point is outputted from the output terminal COUNT_OUT. Consequently, the resistance value of the cell C is converted to the count value C.

In the discharge method, the reference voltage VREF is increased with time for a predetermined time after start of sense by the read method described above. In this manner, it is possible to improve sensitivity in reading a difference between resistance values using a low reference voltage VREF in a region with a low resistance, and to increase the speed of reading using a high reference voltage VREF in a region with a high resistance. Consequently, it is possible to read resistance values with high accuracy at high speed from memory cells possibly having resistance values in a wide range. It is to be noted that "up-slope type" in the present disclosure indicates the method that increases the reference voltage VREF as illustrated in FIG. 11, for example. The up-slope type read method is applicable to, for example, a method of reading a resistance value by utilizing the voltage, which decreases with time, of a node connected to a memory cell.

It is to be noted that time tACT at which the reference voltage VREF starts to be increased may be set to be after the time tS and before the time tE, or may be set to be at the same time as the time tS. For example, in the case where tACT=tS, the constant voltage generation circuit 504 and/or the switch circuit 502 may be omitted.

Figure 12:
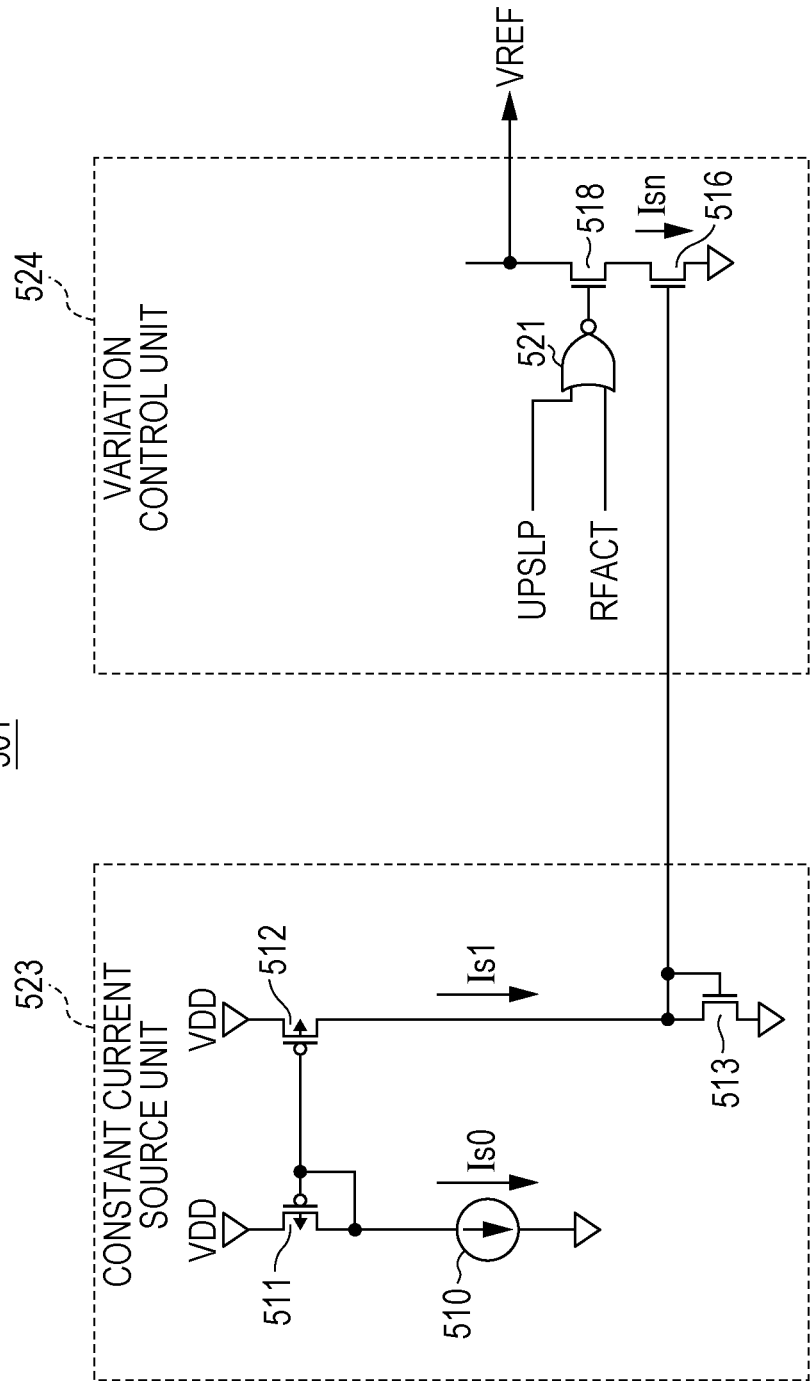
FIG. 12 is a circuit diagram illustrating a second configuration example of the variable voltage generation circuit according to the first embodiment.

FIG. 12 illustrates a second configuration example of the variable voltage generation circuit 501. The variable voltage generation circuit 501 illustrated in FIG. 12 is a down-slope type circuit that decreases the reference voltage VREF with time. Description of the components which are illustrated in FIG. 12 and which are in common with the components illustrated in FIG. 10 may be omitted.

In an overall configuration, the variable voltage generation circuit 501 has a constant current source unit 523 and a variation control unit 524.

In addition to the various components of the constant current source unit 514 illustrated in FIG. 10, the constant current source unit 523 has a P-channel transistor 512 and an N-channel transistor 513. The source terminal of the P-channel transistor 512 receives input of the power supply voltage VDD. The gate terminal of the P-channel transistor 512 is connected to the gate terminal of the P-channel transistor 511, and is connected to the drain terminal of the P-channel transistor 512 in a current mirror configuration. The source terminal of the N-channel transistor 513 is connected to the ground terminal, and the drain terminal and the gate terminal of the N-channel transistor 513 are connected to the drain terminal of the P-channel transistor 512.

The variation control unit 524 has an N-channel transistor 516, an N-channel transistor 518, and a NOR gate 521.

The source terminal of the N-channel transistor 516 is connected to the ground terminal, and the drain terminal of the N-channel transistor 516 is connected to the drain terminal or the source terminal of the N-channel transistor 518. The gate terminal of the N-channel transistor 516 is connected to the drain terminal and the gate terminal of the N-channel transistor 513 in a current mirror configuration.

The gate terminal of the N-channel transistor 518 is connected to the output terminal of the NOR gate 521.

When the N-channel transistor 518 is turned on, mirror current Isn flows and current flows from the reference node to the variation control unit 524, thereby decreasing the reference voltage VREF with time. At this point, the signal UPSLP is in a low level.

It is to be noted that the amount of current of the mirror current Isn is changeable by adjusting the mirror ratio between the N-channel transistors 513 and 516. This allows the amount of variation of the reference voltage VREF per unit time to be adjusted in any way.

Figure 13:
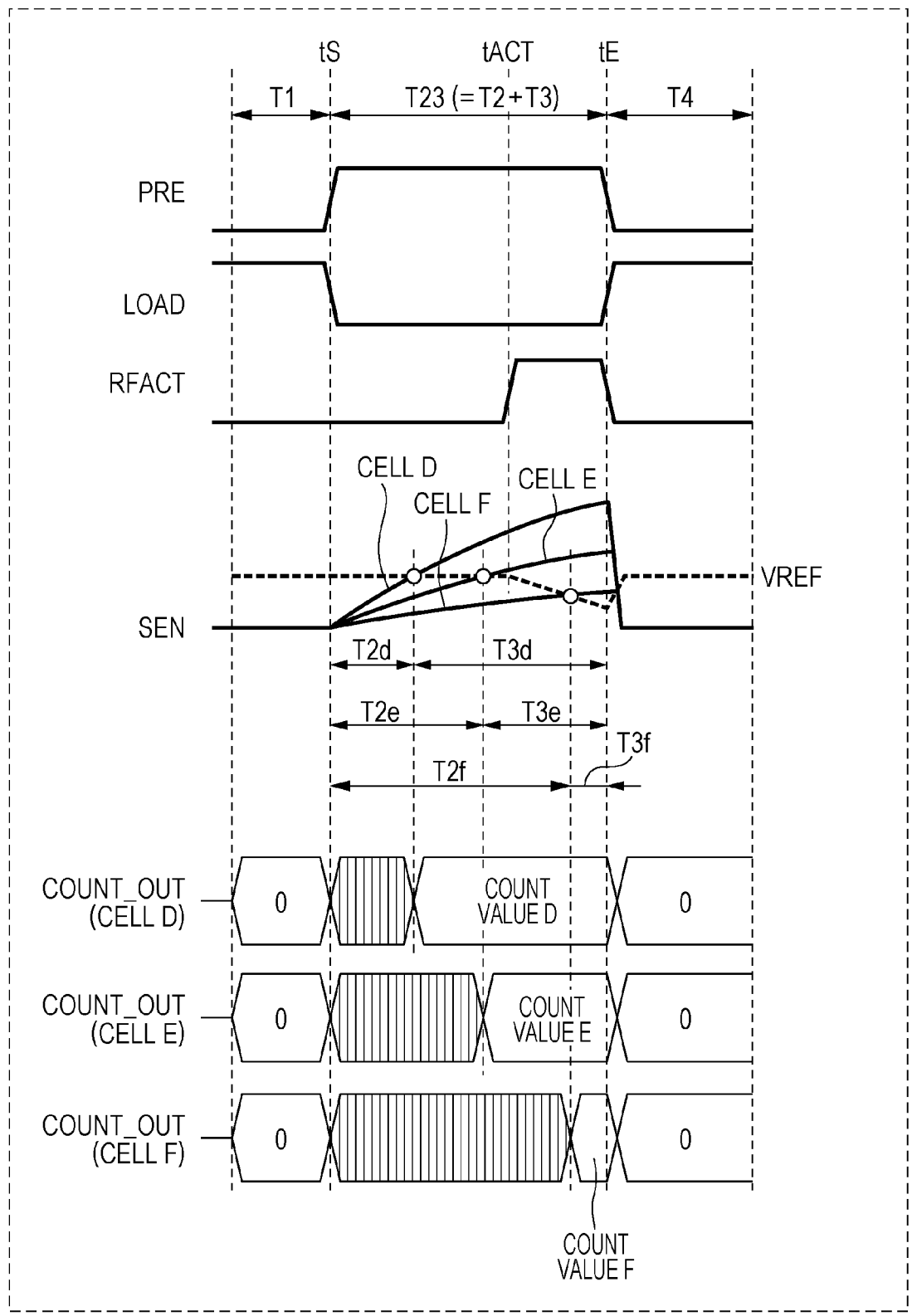
FIG. 13 is a timing chart for a read operation using a charge method according to the first embodiment.

The operation of the read circuit 500 including the constant voltage generation circuit 504 of FIG. 9 and the variable voltage generation circuit 501 of FIG. 12 will be described with reference to the timing chart of FIG. 13. It is to be noted that description of the signals which are illustrated in FIG. 13 and which are in common with the signals illustrated in FIG. 7 is omitted.

During the discharge period T1, the control signal RFACT is in a low level, and thereby the switch circuit 502 electrically connects the constant voltage generation circuit 504 and the reference node. Thus, the reference voltage VREF is a constant voltage VRC outputted by the constant voltage generation circuit 504. At the time tS, the precharge control signal PRE changes from a low level to a high level, and the load control signal LOAD changes from a high level to a low level. Also, at the time tS, the counter 32 starts to count.

The voltage of the sense node SEN in reading the cell D exceeds the reference voltage VREF at the time when time T2d has elapsed since the time tS. Thus, the output signal of the comparator 31 changes, and thereby the counter 32 stops counting. The count value D at this point is outputted from the output terminal COUNT_OUT. Consequently, the resistance value of the cell D is converted to the count value D.

The voltage of the sense node SEN in reading the cell E exceeds the reference voltage VREF at the time when time T2e has elapsed since the time tS. Thus, the output signal of the comparator 31 changes, and thereby the counter 32 stops counting. The count value E at this point is outputted from the output terminal COUNT_OUT. Consequently, the resistance value of the cell E is converted to the count value E.

At the time tACT, the control signal RFACT changes from a low level to a high level, and thereby the switch circuit 502 is set to OFF. This causes the output terminal of the constant voltage generation circuit 504 to be electrically disconnected from the reference node. Simultaneously, the variable voltage generation circuit 501 starts to draw charges from the reference node. Thus, the reference voltage VREF decreases with time.

After that, the voltage of the sense node SEN in reading the cell F exceeds the reference voltage VREF at the time when time T2f has elapsed since the time tS. Thus, before the time T23 has elapsed since the time tS, the output signal of the comparator 31 changes and thereby the counter 32 stops counting. The count value F at this point is outputted from the output terminal COUNT_OUT. Consequently, the resistance value of the cell F is converted to the count value F.

In the discharge method, the reference voltage VREF is decreased with time for a predetermined time after start of sense by the read method described above. In this manner, it is possible to improve sensitivity in reading a difference between resistance values using a high reference voltage VREF in a region with a high resistance, and to increase the speed of reading using a low reference voltage VREF in a region with a low resistance. Consequently, it is possible to read resistance values with high accuracy at high speed from memory cells possibly having resistance values in a wide range. It is to be noted that "down-slope type" in the present disclosure indicates the method that decreases the reference voltage VREF as illustrated in FIG. 13, for example. The down-slope type read method is applicable to, for example, a method of reading a resistance value by utilizing the voltage, which increases with time, of a node connected to a memory cell.

It is to be noted that time tACT at which the reference voltage VREF starts to be decreased may be set to be after the time tS and before the time tE, or may be set to be at the same time as the time tS. For example, in the case where tACT=tS, the constant voltage generation circuit 504 and/or the switch circuit 502 may be omitted.

Figure 14:
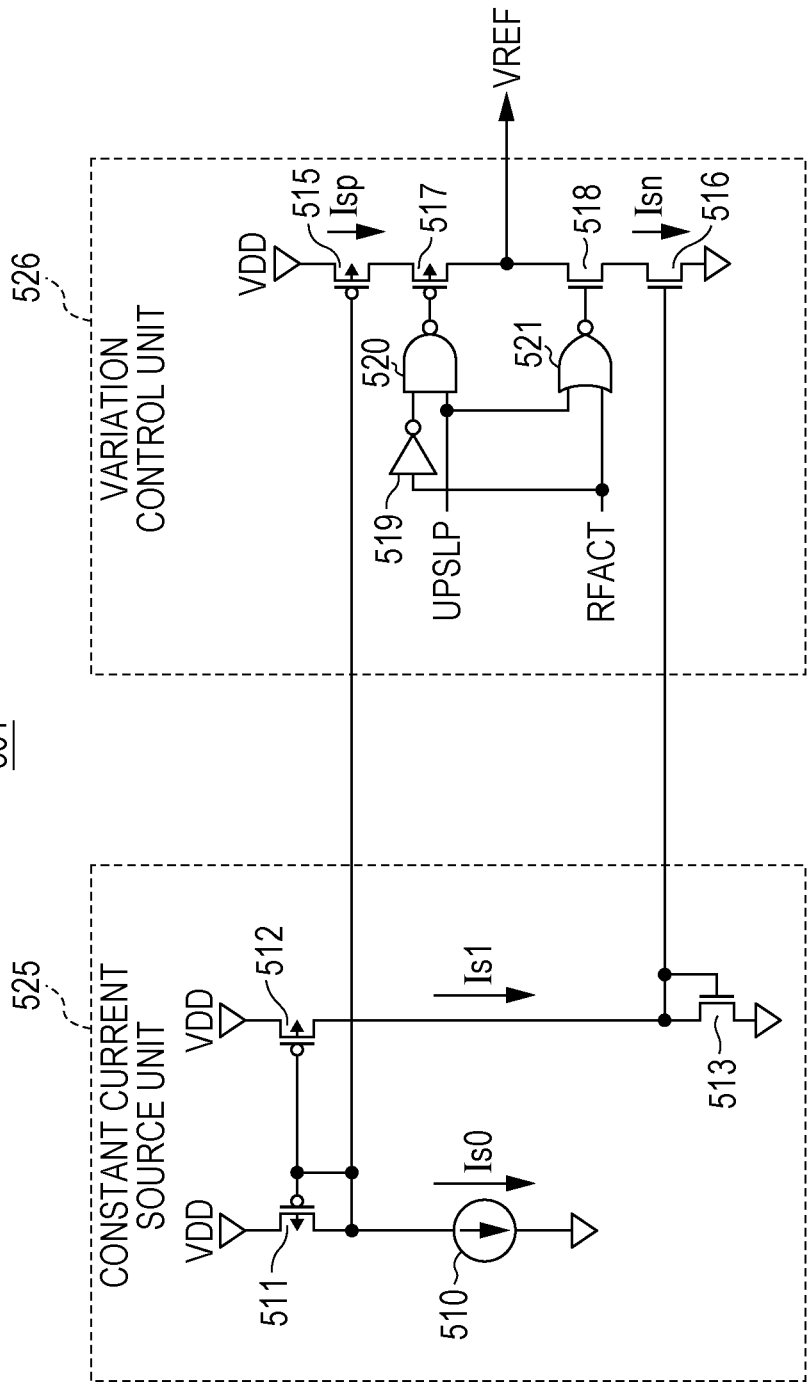
FIG. 14 is a circuit diagram illustrating a third configuration example of the variable voltage generation circuit according to the first embodiment.

FIG. 14 illustrates a third configuration example of the variable voltage generation circuit 501. The variable voltage generation circuit 501 illustrated in FIG. 14 has a constant current source unit 525 and a variation control unit 526, and is capable of providing both up-slope type reading and down-slope type reading. Each component illustrated in FIG. 14 is the same as one of the components illustrated in FIG. 10 and FIG. 12, and thus description is omitted. It is to be noted that when the signal UPSLP is in a high level, the variable voltage generation circuit 501 illustrated in FIG. 14 is in up-slope type mode, and when the signal UPSLP is in a low level, the variable voltage generation circuit 501 is in down-slope type mode.

Since the read circuit described above is capable of supporting both the discharge method and the charge method, it is possible to optimize the read method and the direction of variation of the reference voltage according to the magnitude of resistance written in a memory cell.

Second Embodiment

Hereinafter, a semiconductor device according to a second embodiment will be described. The semiconductor device according to the second embodiment differs from the semiconductor device according to the first embodiment in the configuration of the read circuit and other configurations are the same. Thus, the read circuit according to the second embodiment will be described here.

Figure 15:
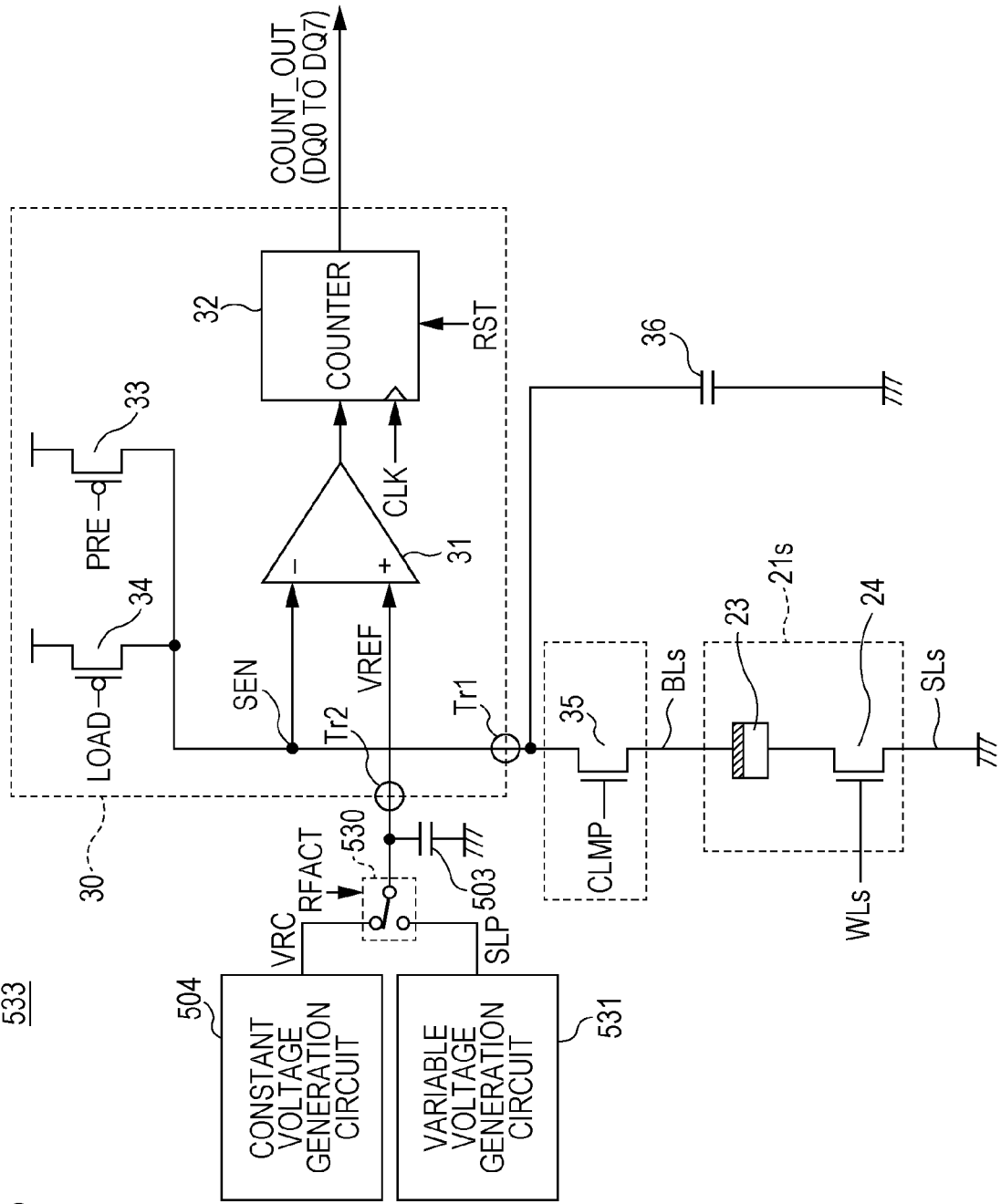
FIG. 15 is a circuit diagram illustrating an example of a schematic configuration of a read circuit according to a second embodiment.

FIG. 15 illustrates an example of a read circuit 533 according to the second embodiment. Description of the components which are of the read circuit 533 illustrated in FIG. 15 and which are in common with the read circuit illustrated in FIG. 8 is omitted.

The read circuit 533 illustrated in FIG. 15 has a variable voltage generation circuit 531 and a switch circuit 530 instead of the variable voltage generation circuit 501 and the switch circuit 502 illustrated in FIG. 8. The circuit including the constant voltage generation circuit 504, the variable voltage generation circuit 531, and the switch circuit 530 is an example of the "circuitry that generates a reference voltage" in the present disclosure.

The switch circuit 530 connects the output terminal of the constant voltage generation circuit 504 or the output terminal of the variable voltage generation circuit 531 to the reference node in response to control signal RFACT inputted from a logic control circuit (not illustrated), for example.

Figure 16:
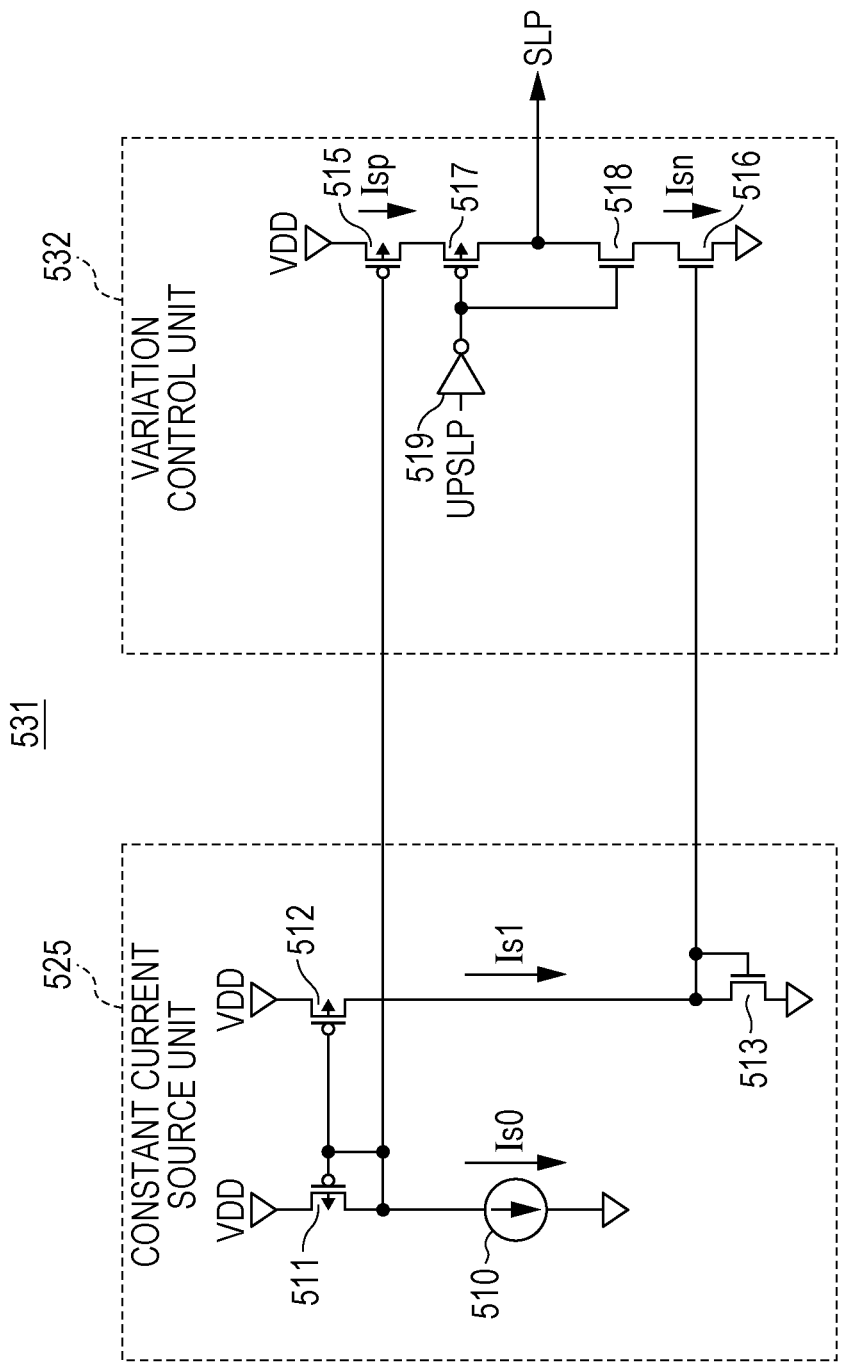
FIG. 16 is a circuit diagram illustrating a configuration example of a variable voltage generation circuit according to the second embodiment.

FIG. 16 illustrates a configuration example of the variable voltage generation circuit 531. Description of the components which are illustrated in FIG. 16 and which are in common with the components illustrated in FIGS. 10, 12 and 14 is omitted.

In an overall configuration, the variable voltage generation circuit 531 has the constant current source unit 525 and a variation control unit 532.

The constant current source unit 525 has the same configuration as illustrated in FIG. 14.

The variation control unit 532 has the P-channel transistor 515, the P-channel transistor 517, the NOT gate 519, the N-channel transistor 516, and the N-channel transistor 518.

The source terminal of the P-channel transistor 517 is connected to the drain terminal of the P-channel transistor 515. The drain terminal of the P-channel transistor 517 is connected to the output terminal of the variable voltage generation circuit 531. The gate terminal of the P-channel transistor 517 is connected to the output terminal of the NOT gate 519. The source terminal of the N-channel transistor 518 is connected to the drain terminal of the N-channel transistor 516. The drain terminal of the N-channel transistor 518 is connected to the output terminal of the variable voltage generation circuit 531. The gate terminal of the N-channel transistor 518 is connected to the output terminal of the NOT gate 519. The input terminal of the NOT gate 519 receives input of signal UPSLP from a logic control circuit (not illustrated), for example.

When the signal UPSLP is in a high level, the P-channel transistor 517 is in an ON state and the N-channel transistor 518 is in an OFF state. Thus, the mirror current Isp flows through the P-channel transistor 515, and a current flows from the variation control unit 532 to the switch circuit 530. Conversely, when the signal UPSLP is in a low level, the P-channel transistor 517 is in an OFF state and the N-channel transistor 518 is in an ON state. Thus, the mirror current Isn flows through the N-channel transistor 516, and a current flows from the switch circuit 530 to the variation control unit 532.

The read circuit 533 illustrated in FIG. 15 is capable of performing the operation described with reference to FIG. 11 and the operation described with reference to FIG. 13. For example, when the control signal RFACT is in a low level, the output terminal of the constant voltage generation circuit 504 is connected to the reference node, and thus the output voltage VRC of the constant voltage generation circuit 504 becomes the reference voltage VREFF. On the other hand, when the control signal RFACT is in a high level, the output terminal of the variable voltage generation circuit 531 is connected to the reference node, and thus the output voltage SLP of the variable voltage generation circuit 531 increases or decreases the reference voltage VREF with time.

Similarly to the semiconductor device according to the first embodiment, the semiconductor device according to the present embodiment is capable of reading resistance values with high accuracy at high speed from memory cells possibly having resistance values in a wide range.

Third Embodiment

Hereinafter, a semiconductor device according to a third embodiment will be described. The semiconductor device according to the third embodiment differs from the semiconductor device according to the first and second embodiments in the configuration of the read circuit and other configurations are the same. Thus, the read circuit according to the third embodiment will be described here.

Figure 17:
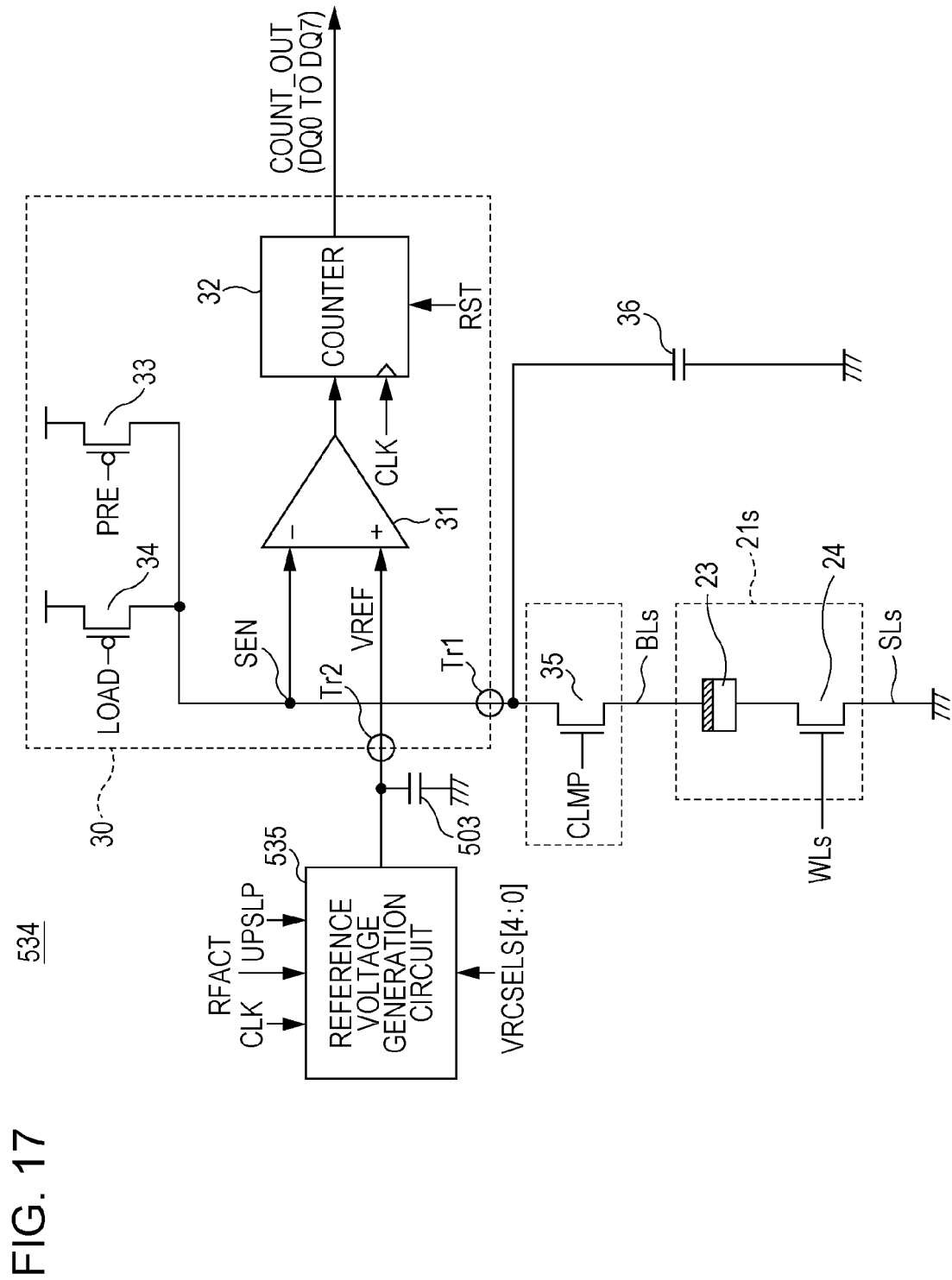
FIG. 17 is a circuit diagram illustrating an example of a schematic configuration of a read circuit according to a third embodiment.

FIG. 17 illustrates an example of a read circuit 534 according to the third embodiment. Description of the components which are of the read circuit 534 illustrated in FIG. 17 and which are in common with the read circuit illustrated in FIGS. 8 and 15 is omitted.

Read circuit 534 illustrated in FIG. 17 has reference voltage generation circuit 535 and capacitor 503. The reference voltage generation circuit 535 is an example of the "circuitry that generates a reference voltage" in the present disclosure. It is to be noted that the capacitor 503 is an optional component.

The reference voltage generation circuit 535 generates the reference voltage VREF. The reference voltage generation circuit 535, when receiving the control signal RFACT, increases or decreases the reference voltage VREF stepwise in response to the signal UPSLP and clock signal CLK.

Figure 18:
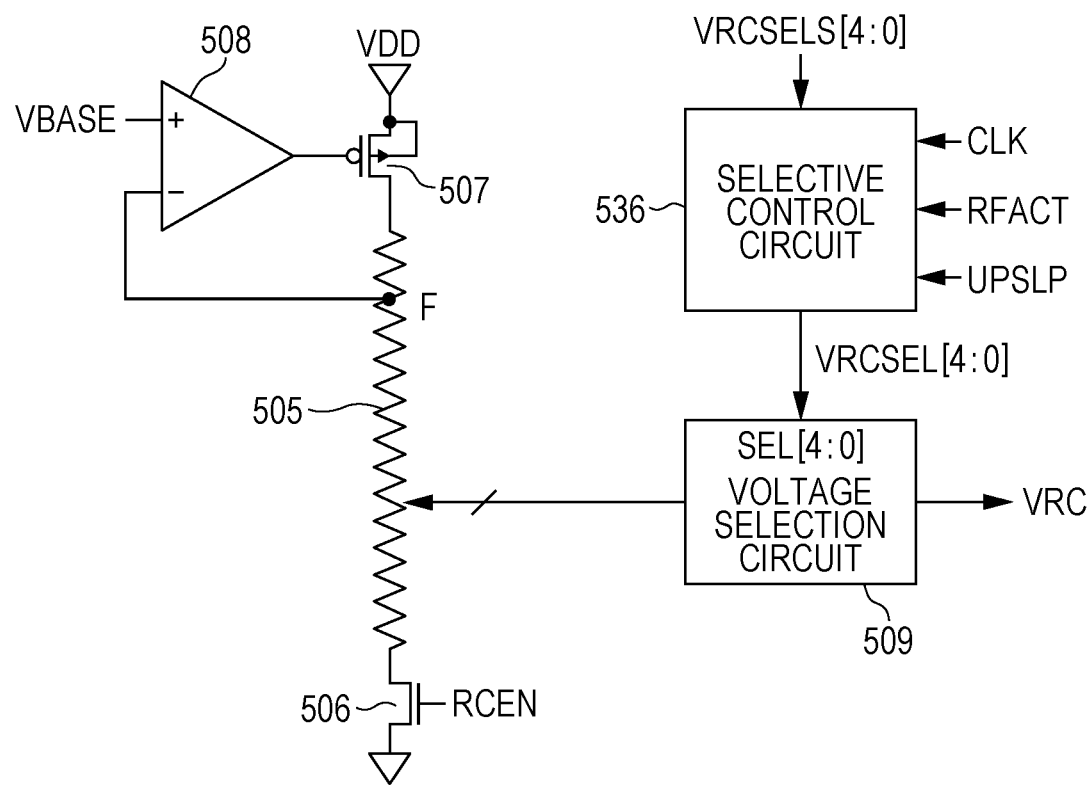
FIG. 18 is a circuit diagram illustrating an example of a schematic configuration of a reference voltage generation circuit according to the third embodiment.

FIG. 18 illustrates a configuration example of the reference voltage generation circuit 535. Description of the components which are illustrated in FIG. 18 and which are in common with the components illustrated in FIG. 9 is omitted.

The reference voltage generation circuit 535 has the voltage selection circuit 509 and a selective control circuit 536.

The voltage selection circuit 509 receives 32 types of divided voltages outputted from the 32 output terminals of the divider resistor 505, for example. The voltage selection circuit 509 then selects one of those divided voltages according to selection signal VRCSEL [4:0], and thus outputs the one divided voltage to the reference voltage generation circuit 535.

The selection control circuit 536 is controlled by, for example, the control signal UPSLP, the control signal RFACT, and the clock signal CLK from a logic control circuit (not illustrated). For example, when a read operation is started, the selection control circuit 536 inputs the initial value VRCSELS [4:0] of the selection signal VRCSEL [4:0] to the voltage selection circuit 509. In addition, the selection control circuit 536 controls the voltage selection circuit 509 so that the reference voltage VREF is increased or decreased at intervals of the period of the clock signal CLK stepwise according to the inputted control signal UPSLP.

Next, an example of an up-slope type read operation by the reference voltage generation circuit 535 will be described with reference to FIG. 19.

Figure 19:
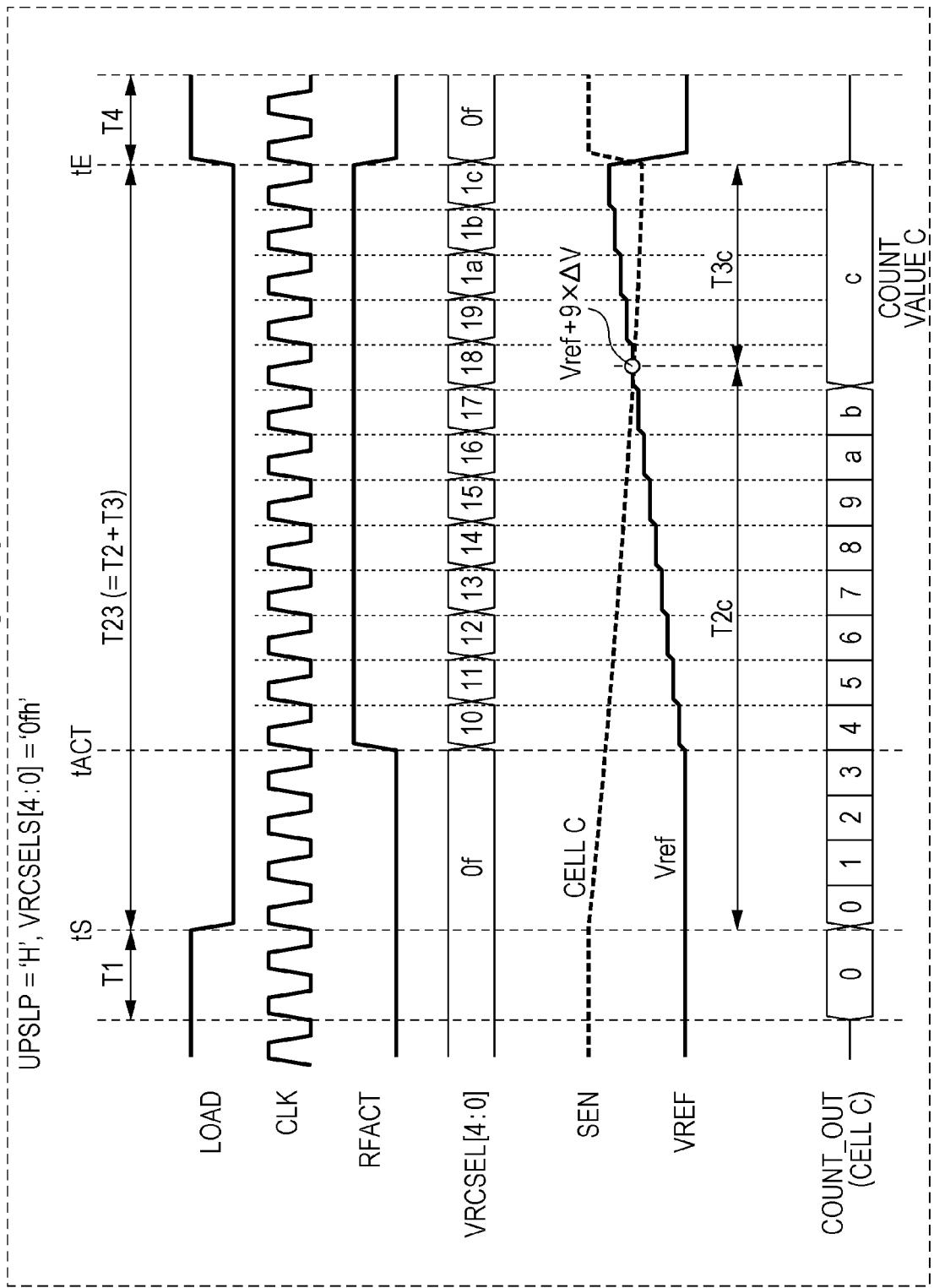
FIG. 19 is a timing chart for a read operation using a discharge method according to the third embodiment.

FIG. 19 is a timing chart for explaining an up-slope type read operation.

In FIG. 19, the control signal UPSLP is in a high level 'H', and the initial value VRCSELS of the selection signal [4:0] is '0 fh' (hexadecimal notation). The clock signal CLK is inputted with a constant frequency. The control signal RFACT is in a low level. The initial value of the reference voltage VREF is voltage Vref. At time tS, the load control voltage LOAD changes from a high level to a low level, a current flows through a selected memory cell (e.g., cell C), and thus the voltage of the sense node SEN starts to decrease. Also, at the time tS, the counter 32 starts to count.

When the control signal RFACT changes from a low level to a high level at time tACT, the reference voltage VREF starts to increase. The reference voltage VREF increases stepwise at intervals of the period of the clock signal CLK. Specifically, whenever the clock signal CLK changes from a low level to a high level, the selection control circuit 536 increments the value of the selection signal VRCSEL [4:0] by one, and the voltage selection circuit 509 thereby increases the reference voltage VREF by ΔV. A specific example is presented in the following.

When VRCSEL [4:0]='0fh', VREF=Vref.
When VRCSEL [4:0]='10h', VREF=Vref+ΔV.
When VRCSEL [4:0]='11h', VREF=Vref+2×ΔV.
When VRCSEL [4:0]='12h', VREF=Vref+3×ΔV.
.
.
.
When VRCSEL [4:0]='18h', VREF=Vref+9×ΔV.

The count value of the counter 32 is incremented by one at intervals of the period of the clock signal CLK. For example, at the time when time T2c has elapsed since the time tS, the voltage of the sense node SEN in reading the selected memory cell (e.g., cell C) falls below the reference voltage VREF=Vref+9×ΔV. Thus, the output signal of the comparator 31 changes, and thereby the counter 32 stops counting. The count value 'c' at this point is outputted from the output terminal COUNT_OUT. Thus, the resistance value of the selected memory cell is converted to a count value.

Next, an example of a down-slope type read operation by the reference voltage generation circuit 535 will be described with reference to FIG. 20.

Figure 20:
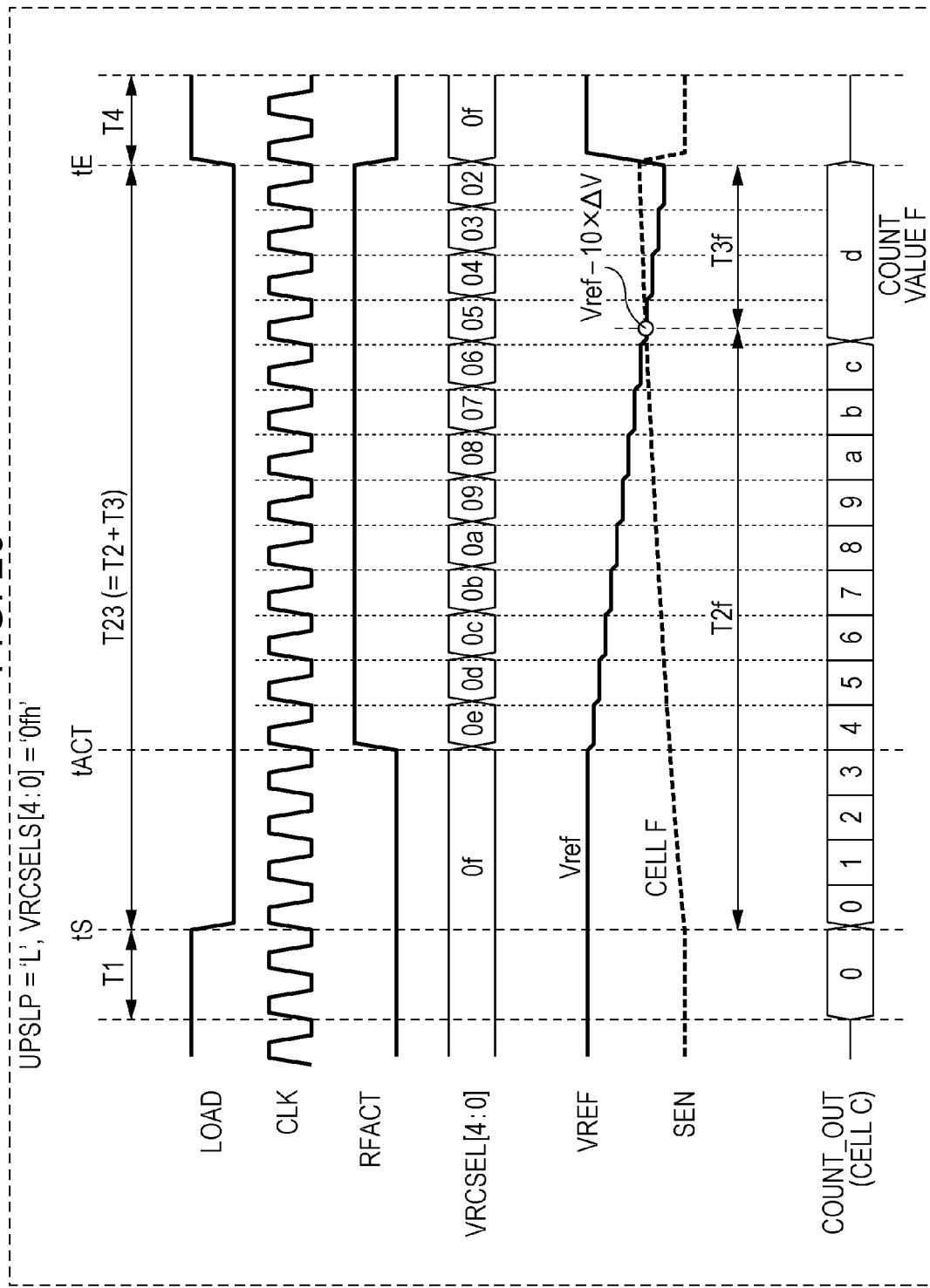
FIG. 20 is a timing chart for a read operation using a charge method according to the third embodiment.

FIG. 20 is a timing chart for explaining a down-slope type read operation.

In FIG. 20, the control signal UPSLP is in a low level 'L', and the initial value VRCSELS of the selection signal [4:0] is '0fh' (hexadecimal notation). The clock signal CLK is inputted with a constant frequency. The control signal RFACT is in a low level. The initial value of the reference voltage VREF is voltage Vref. At time tS, the load control voltage LOAD changes from a high level to a low level, a current flows through a selected memory cell (e.g., cell F), and thus the voltage of the sense node SEN starts to increase. Also, at the time tS, the counter 32 starts to count.

When the control signal RFACT changes from a low level to a high level at time tACT, the reference voltage VREF starts to decrease. The reference voltage VREF decreases stepwise at intervals of the period of the clock signal CLK. Specifically, whenever the clock signal CLK changes from a low level to a high level, the selection control circuit 536 decrements the value of the selection signal VRCSEL [4:0] by one, and the voltage selection circuit 509 thereby decreases the reference voltage VREF by ΔV. A specific example is presented in the following.

When VRCSEL [4:0]='0 fh', VREF=Vref.
When VRCSEL [4:0]='0eh', VREF=Vref−ΔV.
When VRCSEL [4:0]='0dh', VREF=Vref−2×ΔV.
When VRCSEL [4:0]='0ch', VREF=Vref−3×ΔV.
When VRCSEL [4:0]='05h', VREF=Vref−10×ΔV.

The count value of the counter 32 is decremented by one at intervals of the period of the clock signal CLK. For example, at the time when time T2f has elapsed since the time tS, the voltage of the sense node SEN in reading the selected memory cell (e.g., cell F) exceeds the reference voltage VREF=Vref −10×ΔV. Thus, the output signal of the comparator 31 changes, and thereby the counter 32 stops counting. The count value 'd' at this point is outputted from the output terminal COUNT_OUT. Thus, the resistance value of the selected memory cell is converted to a count value.

It is to be noted that in the above description, the period of counting by the counter 32 may not necessarily be the same as the period of change of counting of the selection signal VRDSEL [4:0].

Similarly to the semiconductor device according to the first and second embodiments, the semiconductor device according to the present embodiment is capable of reading resistance values with high accuracy at high speed from memory cells possibly having resistance values in a wide range.

It is to be noted that each of the circuit blocks described in the first to third embodiments may be, for example, a circuit element in a control IC. At least part of each circuit block may be a semiconductor device, an integrated circuit (IC), an LSI (large scale integration), or an electronic circuit as a combination of those devices. LSI or IC may be integrated in a single chip or a plurality of chips may be combined.

The logic control circuit is, for example, a control IC and may include a processor and a memory. A processor may be a CPU (central processing unit) or an MPU (micro-processing unit), for example. For example, a semiconductor device may include a logic control circuit.

Example of Application

The semiconductor device according to the first to third embodiments is applicable to an IC card, for example. An IC card includes, for example, a memory cell array, a read circuit, a write circuit, an input/output interface, and a processor. A memory cell array and a read circuit may be, for example, those that have been described in the first to third embodiments. A write circuit is a circuit that applies an electrical signal to a memory cell, for example. The electrical signal reversibly changes the resistance state of a variable resistance memory element included in the memory cell. Also, an IC card may further include a random number generation circuit.

The detailed configuration of an IC card is described in U.S. patent application Publication Ser. No. 14/679,722 which is incorporated by reference in the present disclosure.

Overview of Embodiments

A semiconductor device according to an aspect of the present disclosure includes: a memory cell array in which a plurality of memory cells is disposed, the memory cells allowing memory information to be identified by an amount of flowing current; and a read circuit that reads the memory information of each of the memory cells. The read circuit includes a variable voltage generation circuit that applies a varying reference voltage to a node of the reference voltage, and a sense amplifier circuit that is electrically connected to one end of a predetermined memory cell, that compares a voltage of a first input terminal and a voltage of a second input terminal, and that detects the memory information of the memory cell based on a result of the comparison, the sense amplifier circuit having the first input terminal to receive input of a voltage corresponding to the memory information of the memory cell and the second input terminal electrically connected to the reference voltage node. When the memory information of the memory cell is read, a variable voltage, which increases or decreases according to the memory information of the memory cell and with reading time, is inputted to the first input terminal. The variable voltage generation circuit applies to the reference voltage node a reference voltage which decreases or increases in a direction opposite to a direction in which the variable voltage inputted to the first input terminal increases or decreases, and the sense amplifier circuit reads the memory information of the memory cell using the reference voltage applied to the reference voltage node.

With this configuration, the voltage of the reference voltage node falls below or exceeds the reference voltage within a reading time, and thus the semiconductor device according to an aspect of the present disclosure is capable of reading information from the memory cell at higher speed.

In an embodiment, the variable voltage generation circuit may be able to set a start time of variation of the reference voltage applied to the reference voltage node to any time after start of the reading.

With this configuration, the semiconductor device according to an aspect of the present disclosure is capable of adjusting a start time of variation of the reference voltage to any time after start of the reading. Consequently, it is possible to adjust a reading time for reading information from a memory cell in any way, and to achieve higher speed reading by an optimal setting.

In an embodiment, the semiconductor device further includes: a constant voltage generation circuit that applies a predetermined constant voltage to the reference voltage node; and a switch circuit disposed between the output terminal of the constant voltage generation circuit, the output terminal of the variable voltage generation circuit, and the reference voltage node. When the memory information of the memory cell is started to be read, a constant voltage outputted by the constant voltage generation circuit is applied to the reference voltage node. The switch circuit may change the current state in which the constant voltage outputted by the constant voltage generation circuit is applied to the reference voltage node to a state in which a reference voltage outputted by the variable voltage generation circuit is applied to the reference voltage node.

With this configuration, the semiconductor device according to an aspect of the present disclosure is capable of setting a start time of variation of the reference voltage to any time.

In an embodiment, when the memory information of the memory cell is read, a voltage, which decreases with time since the first time, may be inputted to the first input terminal, and the variable voltage generation circuit may apply a voltage to the reference voltage node, the voltage increasing with time since the same time as the first time or since a second time after the first time.

In an embodiment, when the memory information of the memory cell is read, a voltage, which increases with time since the first time, may be inputted to the first input terminal, and the variable voltage generation circuit may apply a voltage to the reference voltage node, the voltage decreasing with time since the same time as the first time or since a second time after the first time.

In an embodiment, the memory cell may include a variable resistance memory element that includes a first electrode, a second electrode, and a variable resistance layer disposed between the first electrode and the second electrode.

In an embodiment, the variable resistance memory element may reversibly change between at least two states of a low resistance state and a high resistance state under application of a voltage having one of different polarities across the first electrode and the second electrode.

A semiconductor device according to an another aspect of the present disclosure includes: a memory cell array in which a plurality of memory cells is disposed, the memory cells allowing memory information to be identified by an amount of flowing current; and a read circuit that reads the memory information of each of the memory cells. The read circuit includes a reference voltage generation circuit that applies a reference voltage, which increases or decreases stepwise since at least a first time, and a sense amplifier circuit that is electrically connected to one end of a predetermined memory cell, that compares a voltage of a first input terminal and a voltage of a second input terminal, and that detects the memory information of the memory cell based on a result of the comparison, the sense amplifier circuit having the first input terminal to receive application of a voltage corresponding to the memory information of the memory cell and the second input terminal electrically connected to the reference voltage node. When the memory information of the memory cell is read, a variable voltage, which increases or decreases according to the memory information of the memory cell and with reading time, is inputted to the first input terminal. The reference voltage generation circuit applies to the reference voltage node a reference voltage which decreases or increases stepwise in a direction opposite to a direction in which the voltage inputted to the first input terminal increases or decreases, and the sense amplifier circuit reads the memory information of the memory cell using the reference voltage applied to the reference voltage node.

With this configuration, the semiconductor device according to an another aspect of the present disclosure is capable of reading information from the memory cell at higher speed.

In an embodiment, the reference voltage generation circuit may be able to set a start time of variation of the voltage of the reference voltage node to any time after start of the reading.

With this configuration, the semiconductor device according to an another aspect of the present disclosure is capable of adjusting a start time of variation of the voltage of the reference voltage node to any time after start of the reading. Consequently, it is possible to adjust a reading time for reading information from a memory cell in any way, and to achieve higher speed reading by an optimal setting.

In an embodiment, when the memory information of the memory cell is read, a voltage, which decreases with time since the first time, may be inputted to the first input terminal, and the reference voltage generation circuit may apply a voltage to the reference voltage node, the voltage increasing with time since the same time as the first time or since a second time after the first time.

In an embodiment, when the memory information of the memory cell is read, a voltage, which increases with time since the first time, may be inputted to the first input terminal, and the reference voltage generation circuit may apply a voltage to the reference voltage node, the voltage decreasing with time since the same time as the first time or since a second time after the first time.

In an embodiment, the memory cell may include a variable resistance memory element that includes a first electrode, a second electrode, and a variable resistance layer disposed between the first electrode and the second electrode.

In an embodiment, the variable resistance memory element may reversibly change between at least two states of a low resistance state and a high resistance state under application of a voltage having one of different polarities across the first electrode and the second electrode.

An IC card, which is a still another aspect of the present disclosure, includes one of the semiconductor devices described above.

The semiconductor device according to the present embodiment is capable of reducing the time taken for reading the memory information of a memory cell. Therefore, an IC card including a random number generator in the semiconductor device achieves a high-speed operation with high security and improved randomness due to reduced time of reading.

A method which is a still another aspect of the present disclosure provides a method of reading a semiconductor device including a memory cell array in which a plurality of memory cells is disposed, the memory cells allowing memory information to be identified by an amount of flowing current, and a read circuit that reads the memory information of each of the memory cells, and the read method may include: supplying a variable reference voltage to the read circuit; supplying a variable voltage to the read circuit when the memory information of the memory cells is read, the variable voltage increasing or decreasing according to the memory information of each of the memory cells and with reading time; outputting the reference voltage which decreases or increases in a direction opposite to a direction in which the variable voltage corresponding to the memory information of each of the memory cells increases or decreases; comparing the variable voltage corresponding to the memory information of each of the memory cells with the reference voltage; and detecting the memory information of each of the memory cells based on a result of the comparison.

With this configuration, the reference voltage falls below or exceeds a variable voltage corresponding to the memory information of a memory cell within a reading time, and thus the method of reading a semiconductor device according to another aspect of the present disclosure is capable of reading information from the memory cell at higher speed.

A method which is a still another aspect of the present disclosure provides a method of reading a semiconductor device including a memory cell array in which a plurality of memory cells is disposed, the memory cells allowing memory information to be identified by an amount of flowing current, and a read circuit that reads the memory information of each of the memory cells, and the read method may include: supplying a reference voltage, which increases or decreases stepwise since at least a first time, to a reference voltage node; outputting a voltage which increases or decreases according to the memory information of each of the memory cells and with reading time when the memory information of the memory cells is read; outputting the reference voltage which decreases or increases stepwise in a direction opposite to a direction in which a voltage corresponding to the memory information of each of the memory cells increases or decreases; comparing the voltage corresponding to the memory information of each of the memory cells with the reference voltage applied to the reference voltage node; and detecting the memory information of each of the memory cells based on a result of the comparison.

With this configuration, the reference voltage falls below or exceeds a voltage corresponding to the memory information of a memory cell within a reading time, and thus the method of reading a semiconductor device according to still another aspect of the present disclosure is capable of reading information from the memory cell at higher speed.

A method of reading a resistance value of a memory cell according to an aspect of the present disclosure includes: comparing a reference voltage with a sense voltage that changes at a speed according to the resistance value of the memory cell; and obtaining a value in correlation with the resistance value of the memory cell based on a result of the comparison, wherein in at least part of a period during which the sense voltage changes, the reference voltage is caused to change in a direction opposite to a direction in which the sense voltage changes.

What is claimed is:

1. A semiconductor device comprising:
    a memory cell;
    circuitry that generates a reference voltage; and
    a sense amplifier including a first input terminal electrically connected to the memory cell, and a second input terminal electrically connected to the circuitry,
    wherein the sense amplifier obtains a value in correlation with a resistance value of the memory cell based on a comparison between a sense voltage applied to the first input terminal and the reference voltage applied to the second input terminal, the sense voltage changing at a speed in correlation with the resistance value of the memory cell, and
    in at least part of a period during which the sense voltage changes, the circuitry changes the reference voltage in a direction opposite to a direction in which the sense voltage changes.

2. The semiconductor device according to claim 1,
    wherein the sense voltage decreases at a speed in correlation with the resistance value of the memory cell, and
    in at least part of a period during which the sense voltage decreases, the circuitry increases the reference voltage with lapse of time.

3. The semiconductor device according to claim 1,
    wherein the sense voltage increases at a speed in correlation with the resistance value of the memory cell, and in at least part of a period during which the sense voltage increases, the circuitry decreases the reference voltage with lapse of time.

4. The semiconductor device according to claim 2, wherein the circuitry starts to increase the reference voltage at a certain point in the period in which the sense voltage decreases.

5. The semiconductor device according to claim 3, wherein the circuitry starts to decrease the reference voltage at a certain point in the period in which the sense voltage increases.

6. The semiconductor device according to claim 2, wherein the circuitry increases the reference voltage stepwise.

7. The semiconductor device according to claim 3, wherein the circuitry decreases the reference voltage stepwise.

8. The semiconductor device according to claim 1, wherein the circuitry includes:
   a first circuit that generates a predetermined constant voltage;
   a second circuit that generates a voltage changing with lapse of time; and
   a switch disposed between the first circuit and the first input terminal of the sense amplifier.

9. The semiconductor device according to claim 8, wherein the switch switches between a first state in which the first circuit and the first input terminal of the sense amplifier are connected, and a second state in which the second circuit and the first input terminal of the sense amplifier are connected.

10. The semiconductor device according to claim 1, wherein the memory cell comprises a variable resistance memory element including a first electrode, a second electrode, and a variable resistance layer disposed between the first and second electrodes.

11. The semiconductor device according to claim 10, wherein the variable resistance memory element is configured to
   change from a low resistance state to a high resistance state under application of voltage having a first polarity across the first and second electrodes, and
   change from a high resistance state to a low resistance state under application of voltage having a second polarity opposite to the first polarity across the first and second electrodes.

12. The semiconductor device according to claim 1, further comprising a memory cell array including a plurality of memory cells,
   wherein the memory cell is selected one of the memory cells of the memory cell array.

13. The semiconductor device according to claim 1, wherein the value in correlation with the resistance value of the memory cell is a value of 2 bits or greater.

14. The semiconductor device according to claim 1, wherein the value in correlation with the resistance value of the memory cell is a value corresponding to a time from a predetermined time until an inequality relation between the sense voltage and the reference voltage is reversed.

15. The semiconductor device according to claim 14, wherein the sense amplifier includes
   a comparator that compares the sense voltage with the reference voltage, and
   a counter that continues to count from the predetermined time until the inequality relation between the sense voltage and the reference voltage is reversed.

16. The semiconductor device according to claim 2, wherein the sense amplifier causes electric charges to be charged in at least part of a current path extending between the first input terminal and the memory cell, and
   while the charged electric charges are discharged, the sense voltage decreases at a speed in correlation with the resistance value of the memory cell.

17. The semiconductor device according to claim 3, wherein the sense amplifier causes electric charges to be charged in at least part of a current path extending between the first input terminal and the memory cell, and
   while the electric charges are charged, the sense voltage increases at a speed in correlation with the resistance value of the memory cell.

18. An IC card including the semiconductor device according to claim 1.

* * * * *